US007078941B2

(12) United States Patent
Tsuchi

(10) Patent No.: US 7,078,941 B2
(45) Date of Patent: Jul. 18, 2006

(54) DRIVING CIRCUIT FOR DISPLAY DEVICE

(75) Inventor: Hiroshi Tsuchi, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 70 days.

(21) Appl. No.: 10/775,194

(22) Filed: Feb. 11, 2004

(65) Prior Publication Data

US 2004/0160269 A1 Aug. 19, 2004

(30) Foreign Application Priority Data

Feb. 12, 2003 (JP) ............................ 2003-034131

(51) Int. Cl.
*H03B 1/00* (2006.01)

(52) U.S. Cl. ....................... 327/108; 327/112; 327/74; 327/77

(58) Field of Classification Search ........ 327/108–112, 327/170, 74, 76, 77, 407, 408, 410, 560, 327/561–563; 330/9, 253; 326/82, 83; 345/87, 345/92, 99, 204, 214
See application file for complete search history.

(56) References Cited

U.S. PATENT DOCUMENTS 6,054,876 A * 4/2000 Horie et al. .................. 326/83
6,054,887 A * 4/2000 Horie et al. ................ 327/563
6,567,327 B1 * 5/2003 Tsuchi ........................... 330/9

FOREIGN PATENT DOCUMENTS

JP 5-63464 3/1993
JP 9-130171 5/1997
JP 2000-252768 9/2000

* cited by examiner

*Primary Examiner*—Long Nguyen
(74) *Attorney, Agent, or Firm*—Young & Thompson

(57) ABSTRACT

A driving circuit includes: a first amplifier circuit having a first operating range, for charging and driving an output terminal and a second amplifier circuit having a second operating range, for discharging and driving the output terminal, and an input control circuit for supplying one of a voltage at an upper limit side (V1) of a range common to the first and second operating ranges, a voltage at a lower limit side (V2) of the range, and a target voltage to an input terminal of the first or second amplifier circuit. A driving period for driving the output terminal to the target voltage includes a first period during which the input control circuit supplies the voltage (V1) or the voltage (V2) to the input terminals and a second period (T2) for supplying the target voltage to the input terminals.

23 Claims, 18 Drawing Sheets

FIG . 2

| SWITCH | ONE DATA DRIVING PERIOD (Vin≧Vm) | | ONE DATA DRIVING PERIOD (Vin<Vm) | |
|---|---|---|---|---|
| | PERIOD T1 | PERIOD T2 | PERIOD T1 | PERIOD T2 |
| 11 | OFF | ON | OFF | ON |
| 13 | OFF | OFF | ON | OFF |
| 14 | ON | OFF | OFF | OFF |

FIG . 5

| SWITCH | ONE DATA DRIVIG PERIOD | |
|---|---|---|
| | PERIOD T1 | PERIOD T2 |
| 11A, 11B | OFF | ON |
| 13, 14 | ON | OFF |

FIG . 11

| SWITCH | ONE DATA DRIVING PERIOD ($Vin \geq Vm$) | | ONE DATA DRIVING PERIOD ($Vin < Vm$) | |
|---|---|---|---|---|
| | PERIOD T1 | PERIOD T2 | PERIOD T1 | PERIOD T2 |
| 253 | OFF | ON | OFF | OFF |
| 353 | OFF | OFF | OFF | ON |

DRIVING CIRCUIT FOR DISPLAY DEVICE

FIELD OF THE INVENTION

The present invention relates to a driving circuit for driving a capacitive load to a target voltage within a predetermined driving period. More specifically, the invention relates to a driving circuit suitable as a driver (buffer) or the like in an output stage of the driving circuit for a display device using an active matrix driving method.

BACKGROUND OF THE INVENTION

In recent years, with development of information communication technology, the demand for portable devices such as a cellular phone and a portable information terminal, which have a display unit, increases. Generally, a sufficiently long, continuous time of use is important for the portable device; thus, a liquid crystal display device is widely used for the display unit of the portable device because of its low power dissipation. Conventionally, a transmissive type of the liquid crystal device using a backlight was employed. However, a reflective type of the liquid crystal device using external light without using the backlight has also been developed, thereby achieving lower power dissipation. Then, in recent years, vivid image display as well as high definition is demanded for the liquid crystal display device, so that the demand for the liquid crystal display device using the active matrix driving method that enables more vivid display than a conventional simple matrix method increases. The demand for lower power dissipation of the liquid crystal device is also required for its driving circuit, so that development of the driving circuit with low power dissipation has been actively under way. The driving circuit for the liquid crystal display device using the active matrix driving method will be described below.

The display unit of the liquid crystal display device using the active matrix driving method is typically constituted from a structure that includes a semiconductor substrate, an opposed substrate, and liquid crystals sealed between the two opposed substrates, as is known. Transparent pixel electrodes and thin-film transistors (TFTs) are disposed on the semiconductor substrate. A single transparent electrode is formed on the entire surface of the opposed substrate. By controlling the TFT having a switching function, a predetermined voltage is applied to each pixel electrode. Then, according to a potential difference between each pixel electrode and the electrode of the opposed substrate, transmissivity of the liquid crystal is changed. Then, the liquid crystal having capacitance holds the potential difference and the transmissivity for a predetermined period, thereby displaying an image.

Data lines for sending a plurality of level voltages (gray scale voltages) to be applied to respective pixel electrodes and scanning lines for sending a switching control signal for the TFTs are disposed on the semiconductor substrate. The data lines become capacitive loads due to the capacitances of the liquid crystals sandwiched between the electrode of the opposed substrate and the semiconductor substrate and the capacitances produced at crossings between the data lines and the scanning lines.

FIG. 15 schematically shows a circuit configuration of a typical conventional active matrix type liquid crystal device. Although the display unit includes a plurality of pixels, only an equivalent circuit constituted from one pixel is illustrated in a display unit 801 in FIG. 15, for simplicity. Referring to FIG. 15, the one pixel is composed by a gate line 811, a data line 812, a TFT 814, a pixel electrode 815, a liquid crystal capacitor 816, and a common electrode 817. The gate line 811 is driven by a gate line driving circuit 802, while the data line 812 is driven by a data line driving circuit 803. The gate line 811 and the data line 812 are generally shared by one row of pixels and one column of pixels. The gate line 811 is connected to gate electrodes for a plurality of TFTs in one row of pixels, while the data line 812 is connected to drains (or sources) of a plurality of TFTs in one column of pixels. A source (or drain) of the TFT for the one pixel is connected to the pixel electrode 815.

The grayscale voltage to the respective pixel electrodes is applied via the data line 812, and the grayscale voltage is written in the totality of pixels connected to the data line 812 during one frame period (approximately 1/60 sec). Thus, the data line driving circuit 803 has to drive the data line 812, which is the capacitive load, with a high speed to high voltage accuracy.

As described above, the data line driving circuit 803 needs to drive the data line 812, which is the capacitive load, at high voltage accuracy and at high speed. Further, for an application as the portable device, low power dissipation and area saving are demanded.

Until now, various driving circuits have been proposed as the data line driving circuit. As the driving circuit having the simplest configuration that saves area with a small number of devices, an amplifier circuit as shown in FIG. 16, for example, is known. FIG. 16 shows the amplifier circuit of a voltage follower configuration in which a charging amplifier circuit 20 is combined with a discharging amplifier circuit 30. This amplifier circuit receives the input voltage Vin to perform current amplification for driving an output terminal. The charging amplifier circuit 20 includes a differential unit and an output stage: in the differential unit, a p-channel current mirror circuit 201, 202 is connected to a pair of outputs of an n-channel differential pair 203, 204 driven by a constant current source 205 as a load circuit, and the output stage is composed by p-channel transistor 206 connected between a high-potential power supply VDD and the output terminal 2. Then, a connection node between the drain of the transistor 201 and the drain of the transistor 203 is connected to the control terminal (gate terminal) of the p-channel transistor 206. The control terminals (gate terminals) of the n-channel differential pair 203, 204 constitute a non-inverting input terminal and an inverting terminal, respectively. The control terminals of the n-channel differential pair 203, 204 are connected to an input terminal 1 and the output terminal 2, respectively.

On the other hand, the discharging amplifier circuit 30 includes the differential unit and the output stage: in the differential unit, an n-channel current mirror circuit 301, 302 is connected to a pair of the outputs of a p-channel differential pair 303, 304 driven by a constant current source 305 as the load circuit. The output stage is constituted from an n-channel transistor 306 connected between a low-potential power supply VSS and the output terminal 2. Then, the connection node between the drain of the transistor 301 constituting the output terminal of the differential unit and the drain of the transistor 303 is connected to the control terminal (gate terminal) of an n-channel transistor 306. The control terminals (gate terminals) of the p-channel differential pair 303, 304 constitute the non-inverting input terminal and the inverting input terminal, while the control terminals (gate terminals) of the p-channel differential pair 303, 304 are connected to the input terminal 1 and the output terminal 2, respectively.

Though the driving circuit shown in FIG. 16 has a simple configuration with a small number of devices, each of the operating ranges of the charging amplifier circuit 20 and the discharging amplifier circuit 30 is subject to a constraint. More specifically, when the input voltage Vin to the charging amplifier circuit 20 is around the low-potential power supply VSS, which is lower than the threshold voltage of the n-channel differential pair 203, 204, the n-channel differential pair 203, 204 is turned off. Thus, the output terminal 2 cannot be charged. When the input voltage Vin to the discharging amplifier circuit 30 is within a range from the high-potential power supply VDD to the threshold voltage of the p-channel differential pair 303, 304, the p-channel differential pair 303, 304 is turned off. Thus, the output terminal 2 cannot be discharged.

If voltages (voltages at the input terminal 1) at which transitions of the n-channel differential pair 203, 204 and the p-channel differential pair 303, 304 from an off state to an on state (operable state) take place are set to VL1 and VL2, respectively, the operating range of the charging amplifier circuit 20 is set in the range from the voltage VL1 to the high-potential power supply VDD. In response to the input voltage Vin in this range (VL1≦Vin≦VDD), the charging amplifier circuit 20 can charge and drives the output terminal 2 in a low potential state to the voltage Vin.

The operating range of the discharging amplifier circuit 30 is set in the range from the low-potential power supply VSS to the voltage VL2. In response to the input voltage Vin in this range (VSS≦Vin≦VL2), the discharging amplifier circuit 30 can discharge and drives the output terminal 2 in a high potential state to the voltage Vin.

As described above, the constraints as mentioned above are imposed on the respective operating ranges of the charging amplifier circuit 20 and the discharging amplifier circuit 30.

Accordingly, a voltage between the voltage VL1 and the voltage VL2 is employed as the input voltage Vin to drive the output terminal 2. On the other hand, a configuration as shown in FIG. 17 is known as an operational amplifier that can expand the operating range of the driving circuit in FIG. 16 to a power supply voltage range (refer to Patent Document 1, for example).

[Patent Document 1]

JP Patent Kokai Publication No. JP-A-9-130171 (p.10, FIG. 5)

Referring to FIG. 17, this operational amplifier is constituted from amplifier circuits 62 and 63. Its configuration is the same as the configuration in which loads 209 and 309 are added to the output terminal 2 in FIG. 16. Referring to FIG. 17, same reference characters are assigned to comparable or identical elements, so that a description of the identical elements will be omitted. A transistor 205' in FIG. 17 is the current source for which a current value is defined by a bias voltage VB1 supplied to its gate terminal (which is a constant current source for supplying driving current to the differential pair of transistors 203 and 204 with their sources connected in common). A transistor 305' is the current source for which the current value is defined by a bias voltage VB2 supplied to its gate terminal (for supplying driving current to the differential pair 303, 304). One terminals of the loads 209 and 309 are connected to the output terminal 2, while the other terminals are connected to the low-potential power supply VSS and the high-potential power supply VDD, respectively. The bias voltage VB1 is supplied to the load 209, while the bias voltage VB2 is supplied to the load 309. The amplifier circuits 62 and 63 in Patent Document 1 differentially amplify differential input voltages from first and second input terminals. FIG. 17 shows the voltage follower configuration in which the output terminal is feedback and supplied to the inverting input terminal of the differential amplifier circuit, for comparison with the present invention that will be described later. In the operational amplifier shown in FIG. 17, the loads 209 and 309 are made to function as the loads having predetermined resistances, thereby causing the operational amplifier to operate within the power supply voltage range. More specifically, when the input voltage Vin is lower than the voltage VL1 at which the n-channel differential pair 203, 204 does not operate, the load 309 forms a current path between the high-potential power supply VDD and the output terminal 2. Then, through the operation of the amplifier circuit 63, the output terminal 2 is driven to the voltage Vin. When the input voltage Vin is higher than the voltage VL2 at which the p-channel differential pair 303, 304 does not operate, the load 209 forms the current path between the low-potential power supply VSS and the output terminal 2. Then, through the operation of the amplifier circuit 62, the output terminal is driven to the voltage Vin. When the input voltage Vin is in the rage not less than the voltage VL1 nor more than the voltage VL2 at which the n-channel differential pair 203, 204 and the p-channel differential pair 303, 304 both operate, the amplifier circuits 62 and 63 both operate to drive the output terminal to the voltage Vin. The operational amplifier shown in FIG. 17 expands its operating range to the power supply voltage range using the principle described above.

The driving circuit shown in FIG. 16 is the simplest amplifier circuit generally known. If this is used, the especially area saving driving circuit can be realized. Further, since the number of current paths (the paths of current constantly flowing from the power supply VDD to the VSS) is also small, power dissipation is also comparatively small. With respect to FIG. 17 as well, the operational amplifier with the simple configuration is achieved.

SUMMARY OF THE DISCLOSURE

By the way, in the data line driving circuit of the display device for the application as the portable device, cutting down the power dissipation as much as possible is demanded. For this reason, reduction in the potential difference between the high-potential power supply VDD and the low-potential power supply VSS is required. For this purpose, the data line driving circuit is required to operate over the entire power supply voltage range.

In the case of the driving circuit shown in FIG. 16, the output terminal 2 in the high potential state cannot be discharged to a voltage higher than the voltage VL2; further, the output terminal 2 in the low potential state cannot be charged to a voltage lower than the voltage VL1, either.

Accordingly, the driving circuit shown in FIG. 16 has a problem that it cannot be operated over the entire power supply voltage range.

On the other hand, in the driving circuit shown in FIG. 16, even if charging to a voltage higher than the voltage VL2 and discharging to a voltage lower than the voltage VL1 could be performed, there are cases where overshooting and undershooting has occurred, so that driving to a target voltage (which is referred to as a “target voltage”) cannot be performed. By way of example, an example of a waveform in the case where the output terminal 2 was driven to a target voltage higher than the VL2 from around the VSS is shown in FIG. 18. FIG. 18 shows the waveform in which the target voltage was greatly overshot due to a large voltage change in the output terminal.

The reason for such overshooting and undershooting is due to a delay in response caused by parasitic capacitances of elements constituting the amplifier circuits. In the amplifier circuits of a feedback type shown in FIGS. 16 and 17, in particular, overshooting and undershooting tend to be developed in an output voltage waveform. That is, they are phenomena in which an output voltage changes during the delay in the response during which a change in the voltage at the output terminal is transmitted to an input and then reflected in the output terminal again. And then, the larger the change in the output voltage, the greater overshooting and undershooting will become.

With regard to the liquid crystal display device for the application as the portable device, in particular, a method of ac driving the voltage of the opposed substrate electrode so as to perform polarity inversion; thus, the voltage of the opposed substrate electrode changes for each data driving period. Since this change propagates to a data line on the display panel through liquid crystal capacitance, the voltage at the data line at a start of one data driving period may have changed from a driving voltage during the immediately preceding data output period or may have temporarily changed to a level beyond the power supply voltage range. Accordingly, in the data line driving circuit of the liquid crystal device for the application as the portable device, it is required that the output terminal at an arbitrary potential state be driven to a target voltage.

As described above, the driving circuit shown in FIG. 16 has the problem that it cannot drive the output terminal to a target voltage within the power supply voltage range and that it is difficult to drive the output terminal at high accuracy when the target voltage is around the power supply voltage.

On the other hand, the driving circuit shown in FIG. 17 can drive the output terminal to an arbitrary target voltage within the power supply voltage range. However, the driving circuit in FIG. 17 has the problem that when current flowing through the loads 209 and 309 is sufficiently reduced for lower power dissipation, great overshooting (as shown in FIG. 18) or great undershooting develops as in the driving circuit shown in FIG. 16 when a change in the voltage at the output terminal 2 is large, so that the voltage at the output terminal cannot be quickly brought back to the target voltage. When the current flowing through the loads 209 and 309 is set to be large in the driving circuit (operational amplifier circuit) shown in FIG. 17, the voltage at the output terminal voltage can be quickly brought back from an overshooting or undershooting level and can be driven to the target voltage. However, in this case, the problem of an increase in the power dissipation arises.

On the other hand, amplifier circuits that can perform driving to a target voltage within the power supply voltage range at high speed and at high accuracy are known (refer to Patent Documents 2 and 3, for example).

[Patent Document 2]

JP Patent Kokai Publication No. JP-A-5-63464 (pp. 3–4, FIG. 1)

[Patent Document 3]

JP Patent Kokai Publication No. JP-P2000-252768A (pp. 14–15, FIG. 1)

However, the driving circuits described in the above Patent Documents 2 and 3 have the problems that the number of the elements therein is great, a required area is large, and the power dissipation is large due to the configuration having a lot of current paths.

Accordingly, it is an object of the present invention to provide a driving circuit for driving a capacitive load to a desired voltage(target voltage) that can achieve area saving and lower power dissipation and can drive an output terminal in an arbitrary potential state to an arbitrary target voltage within a power supply voltage. More specifically, it is another object of the present invention to provide a driving circuit that can suppress overshooting and undershooting and can quickly drive the output terminal to a target voltage even if a potential difference from an electric potential of the output terminal at a start of one data period to the target voltage is relatively large.

The above and other objects are attained by a driving circuit in accordance with one aspect of the present invention which comprises:

a first amplifier circuit having a first operating range, for charging and driving an output terminal;

a second amplifier circuit having a second operating range, for discharging and driving the output terminal; and an input control circuit for selecting at least one of a voltage at an upper limit side of an overlapped portion between the first operating range and the second operating range, a voltage at a lower limit side of the overlapped portion, and a target voltage for supply to the input terminal of the first amplifier circuit or the input terminal of the second amplifier circuit;

wherein for a driving period for driving the output terminal to the target voltage, a first period for supplying the voltage at the upper limit or the voltage at the lower limit to the input terminals of the first and second amplifier circuits by the input control circuit and a second period for supplying the target voltage to the input terminals of the first and second amplifier circuits by the input control circuit are provided.

In the present invention, the input control circuit may supply either of the voltage at the upper limit and the voltage at the lower limit to both of the input terminals of the first and second amplifier circuits, during the first period.

In the present invention, the input control circuit may supply the voltage at the lower limit to the input terminal of the first amplifier circuit and may supply the voltage at the upper limit to the input terminal of the second amplifier circuit, during the first period.

Further, in the driving circuit according to other aspect of the present invention, the first amplifier circuit may include:

a differential pair of a first polarity for differentially receiving input signal voltages from a non-inverting input terminal thereof and an inverting input terminal thereof; and a first transistor connected between a first power supply and the output terminal, for receiving the outputs of the differential pair of the first polarity at a control terminal thereof;

the second amplifier circuit may include:

a differential pair of a second polarity for differentially receiving the input signal voltages from a non-inverting input terminal thereof and an inverting input terminal thereof; and a second transistor connected between a second power supply and the output terminal, for receiving the outputs of the differential pair of the second polarity at a control terminal thereof.

Further, in the present invention, a switch connected between the input terminal to which the target voltage is supplied and the output terminal may be provided.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWING

FIGS. 1A and 1B are diagrams showing a configuration of a first embodiment according to the present invention, in which FIG. 1A is a diagram showing a circuit configuration, and FIG. 1B is a diagram showing the operating ranges of amplifier circuits in the embodiment;

FIG. 2 is a table showing control over switches included in an input control circuit in the first embodiment;

FIGS. 4A and 4B are diagrams showing a configuration of a second embodiment according to the present invention, in which FIG. 4A is a diagram showing a circuit configuration, while FIG. 4B is a diagram showing the operating ranges of amplifier circuits in the embodiment;

FIG. 5 is a table showing control over switches included in an input control circuit in the second embodiment;

FIG. 11 is a table showing control over switches included in amplifier circuits in the second embodiment of the present invention;

PREFERRED EMBODIMENTS OF THE INVENTION

The principle and an operation of a driving circuit according to the present invention will be described below. The following is a description of practicing modes of the present invention with reference to drawings, applied to a driving circuit for driving a capacitive load such as a data line of a liquid crystal display device to a desired (target) voltage within a predetermined period.

The driving circuit according to one aspect of the present invention includes a first amplifier circuit (20), a second amplifier circuit (30), and an input control circuit (10). The first amplifier circuit (20) has a first operating range (from a voltage VL1 defined by a threshold voltage to a high-potential power supply voltage VDD) and performs a charging operation of an output terminal (2). The second amplifier circuit has a second operating range (from a low-potential power supply voltage VSS to a voltage VL2 defined by a threshold voltage), and performs a discharging operation of the output terminal (2). The input control circuit (10) performs control so that at least one of a voltage (V1) which is located at a lower limit side of an overlapped portion between the first operating range and the second operating range, a voltage (V2) which is located at an upper limit side of the overlapped portion, and a target voltage (an input terminal voltage Vin) is supplied to the input terminal of the first amplifier circuit and/or the input terminal of the second amplifier circuit. A driving period for driving the output terminal (2) to a target voltage includes at least a first period (T1) and a second period (T2). During the first period (T1), the input control circuit (10) performs control so that the first voltage (V1), the second voltage (V2), or the first and second voltages are supplied to the input terminal of the first amplifier circuit (20) and the input terminal of the second amplifier circuit (30). During the second period (T2), the input control circuit (10) performs control so that the target voltage (Vin) is supplied in common to the input terminal of the first amplifier circuit (20) and the input terminal of the second amplifier circuit (30).

Figure 1A:
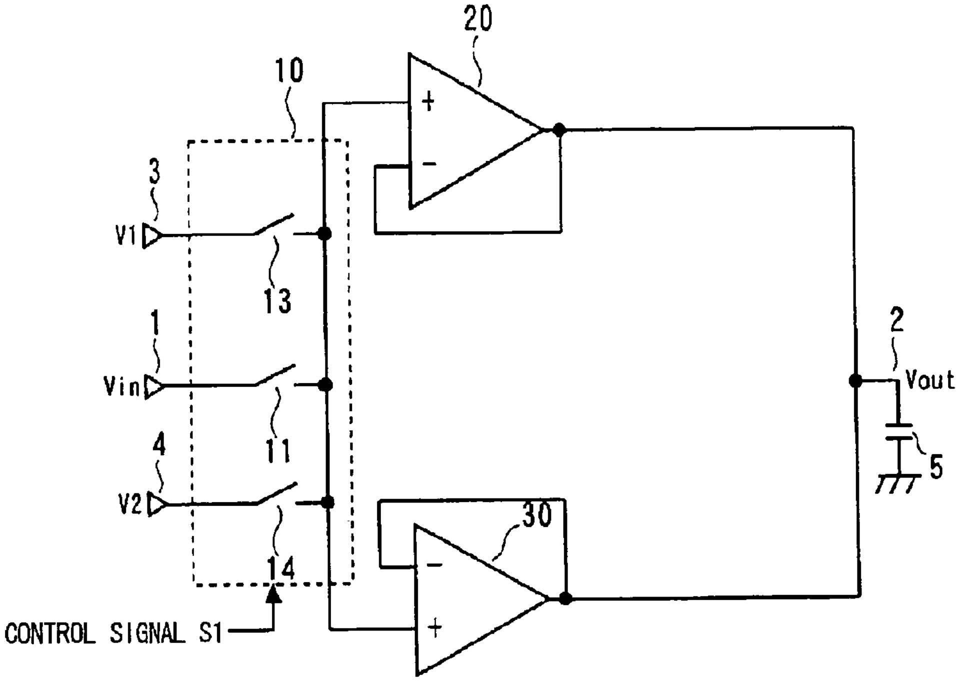
Figure 1B:
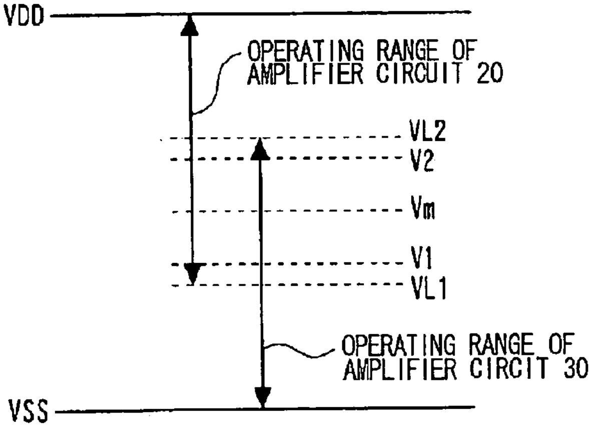

FIGS. 1A and 1B are diagrams showing a driving circuit according to a first embodiment of the present invention. FIG. 1A shows a configuration of the driving circuit which includes a charging amplifier circuit 20, a discharging amplifier circuit 30, and an input control circuit 10. FIG. 1B is a diagram showing operating ranges of the charging amplifier circuit 20 and the discharging amplifier circuit 30. A description will be given below with reference to FIGS. 1A and 1B.

The charging amplifier circuit 20 and the discharging amplifier circuit 30 are of a voltage follower configuration in which their respective inverting input terminals (designated by minus terminals) are connected to the output terminal 2, and each of the circuits receiving a voltage supplied to its non-inverting input terminal(designated by plus terminal) to charge and drive or discharge and drive the output terminal 2 to which a capacitive load 5 is connected. The non-inverting (+) input terminals of the charging amplifier circuit 20 and the discharging amplifier circuit 30 are connected in common.

The input control circuit 10 includes first through third switches 11, 13, and 14. One terminals of the first through third switches 11, 13, and 14 are respectively connected to a first terminal 1, a second terminal 3, and a third terminal 4 to which a voltage Vin, a voltage V1, and a voltage V2 are supplied respectively. The other terminals of the first through third switches 11, 13, and 14 are connected in common to the non-inverting (+) input terminals of the charging amplifier circuit 20 and the discharging amplifier circuit 30, connected in common. The respective switches 11, 13, and 14 of the input control circuit 10 are controlled to be turned on/off by a control signal S1.

The operating range of the charging amplifier circuit 20 is set in the range from the voltage VL1 to the high-potential supply voltage VDD. The output terminal 2 in a low potential state can be charged and driven, with respect to the input voltage Vin in this range (where VL1≦Vin≦VDD).

The operating range of the discharging amplifier circuit 30 is set in the range from the low-potential supply voltage VSS to the voltage VL2. The output terminal 2 in a high potential state can be discharged and driven, with respect to the input voltage Vin in this range (where VSS≦Vin≦VL2).

The voltages V1 and V2 are set to voltages at lower and upper side of a predetermined reference voltage Vm close to the lower limit and upper limit voltages VL1 and VL2, respectively, wherein Vm is provided within the common operating region (within an overlapped range) of the charging amplifier circuit 20 and the discharging amplifier circuit 30. As shown in FIG. 1B, for example, the following relation holds.

$$VSS<VL1<V1<Vm\leqq V2<VL2<VDD$$

Next, control and an operation of the input control circuit 10 in the driving circuit in FIG. 1 will be described with reference to FIG. 2. FIG. 2 shows examples of manners in which the first through third switches 11, 13, and 14 are controlled during one data driving period for driving the output terminal 2 to the target voltage.

Two periods constituted from the first period T1 and the second period T2 are provided for the one data driving period. Control over the respective switches shown in FIG. 2 differs depending on cases where the input signal voltage Vin is equal to or larger than the reference voltage Vm (Vin≧Vm) and the Vin is less than the Vm (Vin<Vm). The control signal S1 for controlling the input control circuit 10 is the signal for controlling switching on and off of the first through third switches 11, 13, and 14 responsive to the magnitude relationship between the Vin and the Vm and timings of the periods T1 and T2. The control signal S1 may be comprised of three signal lines supplied to the control terminals of the first through third switches 11, 13, and 14 respectively.

The present embodiment is the case where the input control circuit 10 supplies either of the voltage V1 or voltage V2 to both of the input terminals of the charging amplifier circuit 20 and the discharging amplifier circuit 30 during the first period T1. More specifically, referring to FIG. 2, when the input voltage Vin is equal to or more than the reference voltage Vm, only the third switch 14 is turned on and the voltage V2 (<VL2) is supplied to the non-inverting (+) input terminals of the charging amplifier circuit 20 and the discharging amplifier circuit 30 during the first period T1. Since the charging amplifier circuit 20 and the discharging amplifier circuit 30 can both operate at this point, the output terminal 2 is driven to the voltage V2 irrespective of its potential state before the first period T1.

Next, during the second period T2, only the first switch 11 is turned on, and the input voltage Vin is supplied to the charging amplifier circuit 20 and the discharging amplifier circuit 30.

If the input voltage Vin is equal to or more than the voltage V2 at this point, the output terminal 2 is driven to the voltage Vin through a charging operation of the charging amplifier circuit 20.

When the input voltage Vin is not less than the reference voltage Vm nor more than the voltage V2, the output terminal 2 is driven to the voltage Vin through a discharging operation of the discharging amplifier circuit 30.

Accordingly, the output terminal 2 is driven to the voltage Vin with respect to an arbitrary input voltage Vin not less than the reference voltage Vm nor more than the high-potential supply voltage VDD.

On the other hand, when the input voltage Vin is less than the reference voltage Vm, only the second switch 13 is turned on, and the voltage V1 is supplied to the charging amplifier circuit 20 and the discharging amplifier circuit 30 during the first period T1. Since the charging amplifier circuit 20 and the discharging amplifier circuit 30 can both operate at this point, the output terminal 2 is driven to the voltage V1 irrespective to its potential state before the first period T1.

Next, during the second period T2, only the first switch 11 is turned on, and the input voltage Vin is supplied to the charging amplifier circuit 20 and the discharging amplifier circuit 30. If the input voltage Vin is equal to or less than the voltage V1 at this point, the output terminal 2 is driven to the voltage Vin through the discharging operation of the discharging amplifier circuit 30.

If the input voltage is not less than the voltage V1 and less than the reference voltage Vm, the output terminal 2 is driven to the voltage Vin through the charging operation of the charging amplifier circuit 20.

Accordingly, the output terminal 2 can be driven to the voltage Vin with respect to an arbitrary input voltage Vin not less than the low-potential supply voltage VSS and less than the reference voltage Vm. As described above, under the control shown in FIG. 2, the output terminal 2 is driven to the voltage V1 or the voltage V2 once, thereby enabling driving that does not depend on its potential state at the start of one data period. Then, when the input voltage Vin is lower than the voltage V1, the switch 13 is turned on during the period T1, and then the output terminal 2 is driven to the voltage V1 once. Thus, the potential difference from the voltage V1 to the voltage Vin is small. Accordingly, undershooting when the output terminal 2 is driven to the voltage Vin can be suppressed to a small level, so that quick driving becomes possible. When the input voltage Vin is higher than the voltage V2, the switch 14 is turned on during the period T1, and the output terminal 2 is then driven to the voltage V2 once. Thus, the potential difference from the voltage V2 to the voltage Vin is small. Accordingly, overshooting when the output terminal 2 is driven to the voltage Vin can be suppressed to a small level, so that quick driving becomes possible. When the input voltage Vin is not less than the voltage V1 nor more than the voltage V2, the charging amplifier circuit 20 and the discharging amplifier circuit 30 can both operate. Thus, the output terminal can be quickly driven to the voltage Vin.

Then, if the desired voltage (a target voltage) is supplied as the input voltage Vin, the output terminal 2 can be driven to the target voltage with respect to an arbitrary voltage Vin within a power supply voltage range.

Figure 3A:
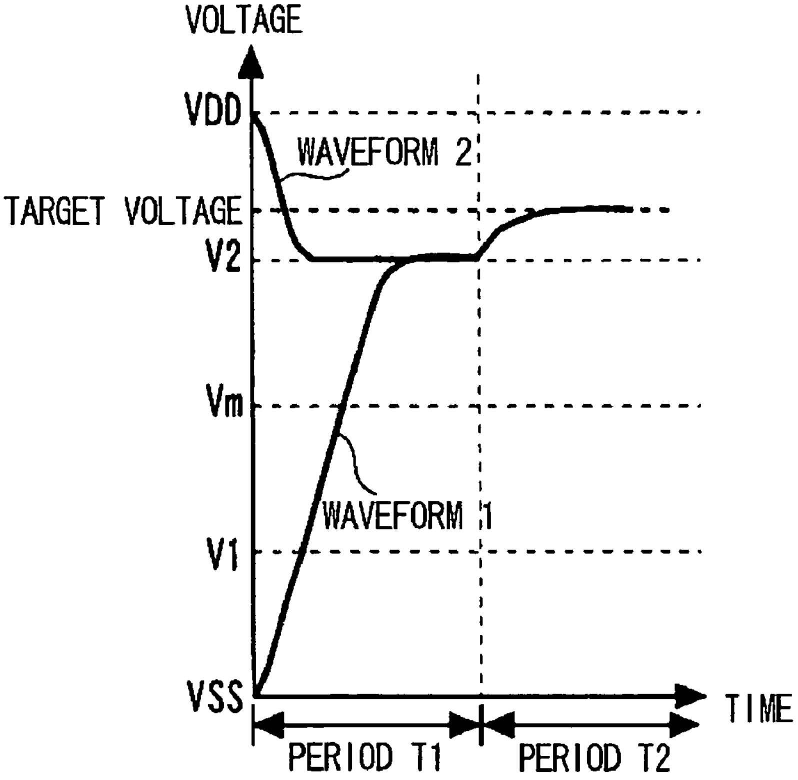
FIGS. 3A and 3B show examples of voltage waveforms for explaining an operation of the first embodiment.
Figure 3B:
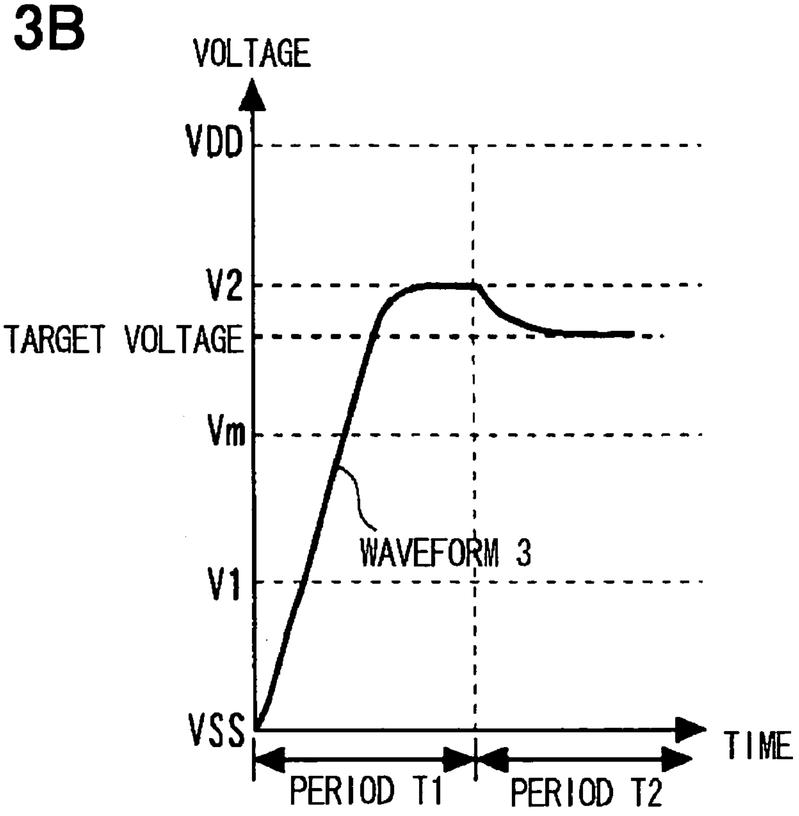

FIGS. 3A and 3B will be referred to so as to describe the operation of the circuit according to the present invention in more detail. FIGS. 3A and 3B are diagrams showing examples of driven waveforms when the input voltage Vin is equal to or more than the reference voltage Vm.

Referring to FIG. 3A, waveforms 1 and 2 are examples of the waveforms when the target voltage Vin used for driving the output terminal 2 is higher than the voltage V2. The waveform 1 shows the waveform that has changed from around the low-potential supply voltage VSS, while the waveform 2 is the waveform that has changed from around the high-potential supply voltage VDD.

A waveform 3 in FIG. 3B shows an example of the waveform when the target voltage is between the reference voltage Vm and the voltage V2, and is the waveform that has changed from around the low-potential supply voltage VSS.

During the first period T1, the respective waveforms are driven to the voltage V2 once, and during the second period T2, the respective waveforms are driven to the target voltage. Once driven to the voltage V2 during the first period T1 in this manner, the potential difference between the voltage V2 and the target voltage for final driving is reduced, and falls within the range of a certain small potential difference.

Figure 16:
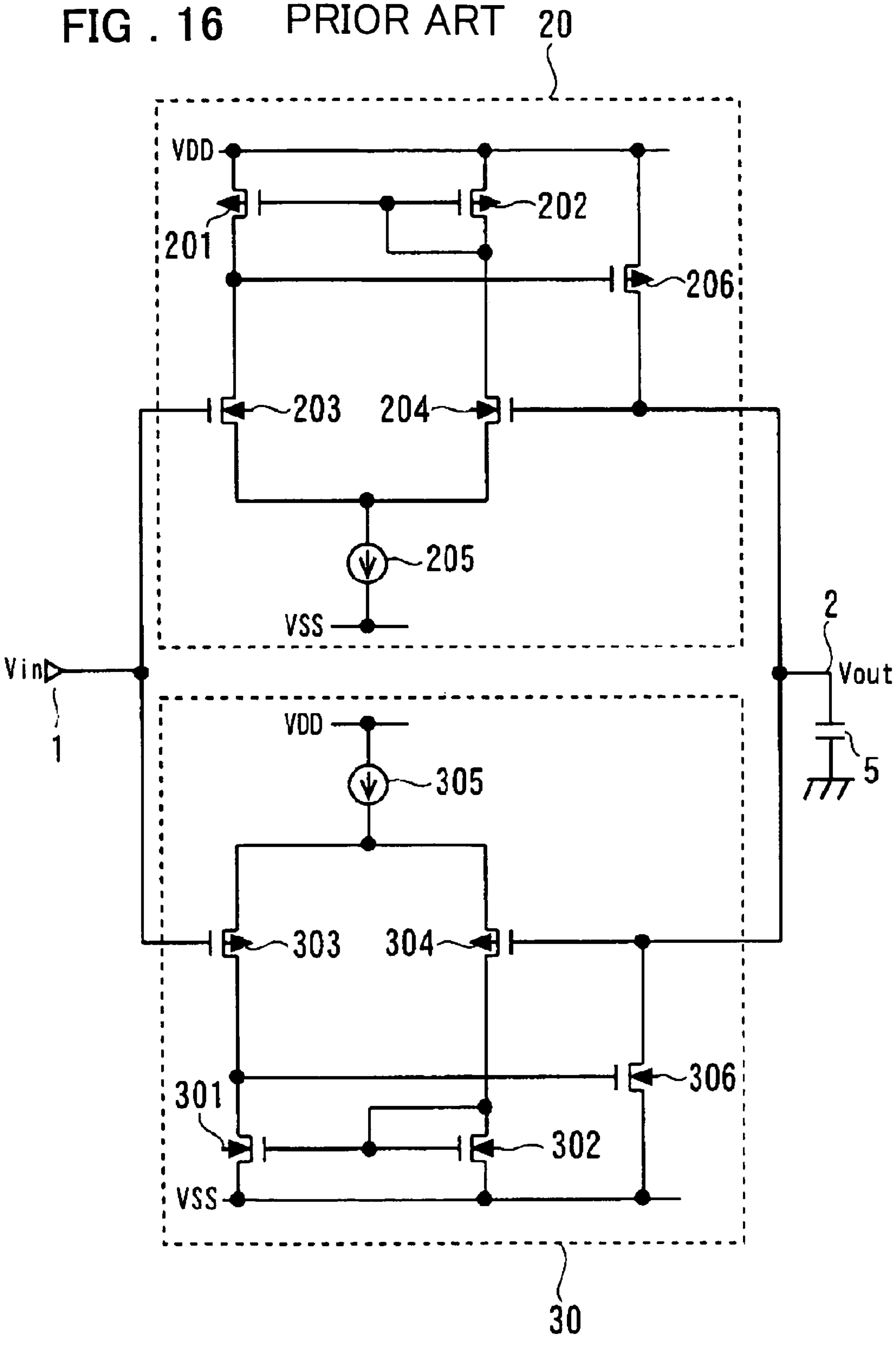
FIG. 16 PRIOR ART
FIG. 16 is a diagram showing a configuration of a conventional amplifier circuit.
Figure 17:
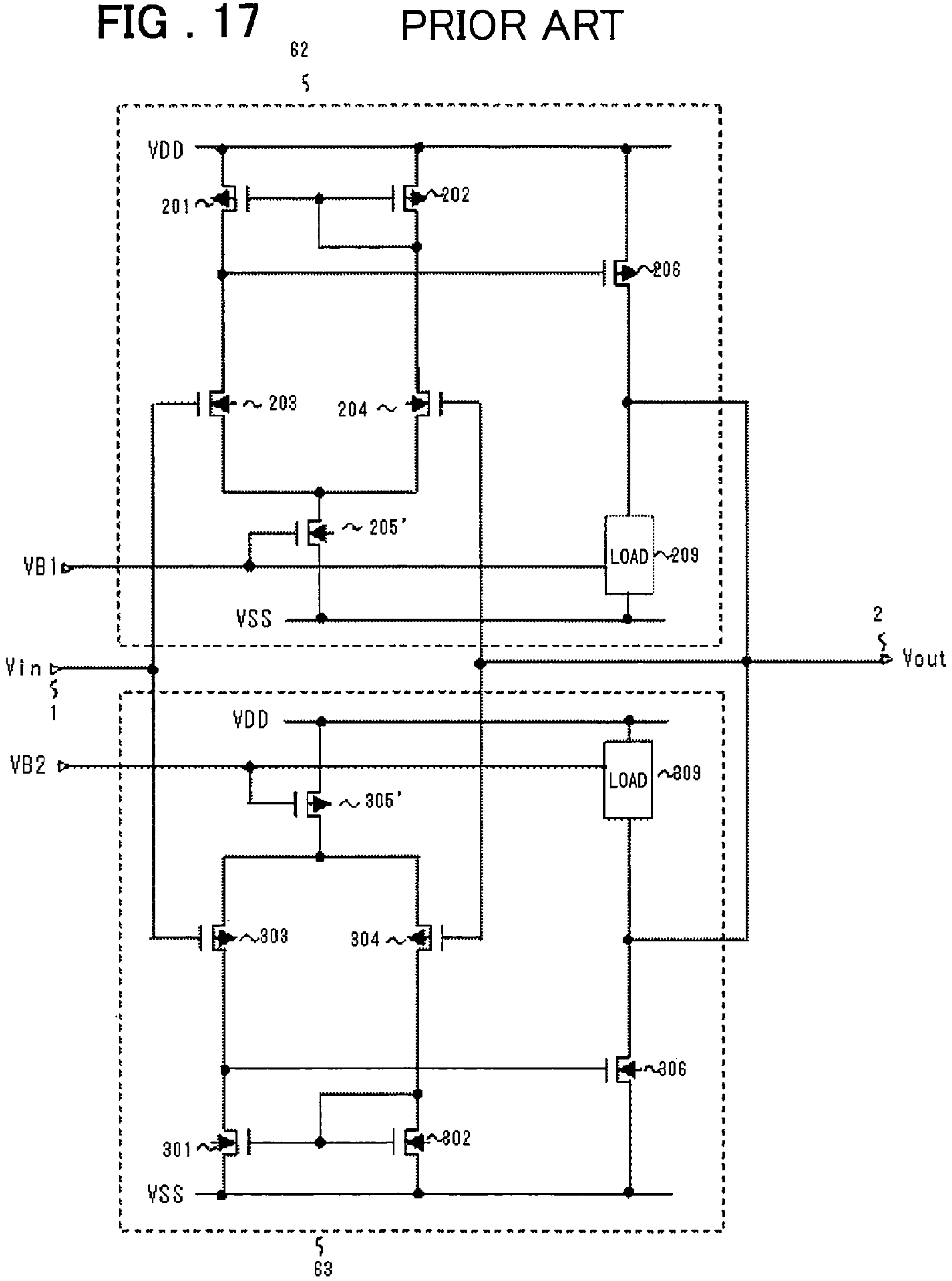
FIG . 17 PRIOR ART
FIG. 17 is a diagram showing a configuration of another conventional amplifier circuit.
Figure 18:
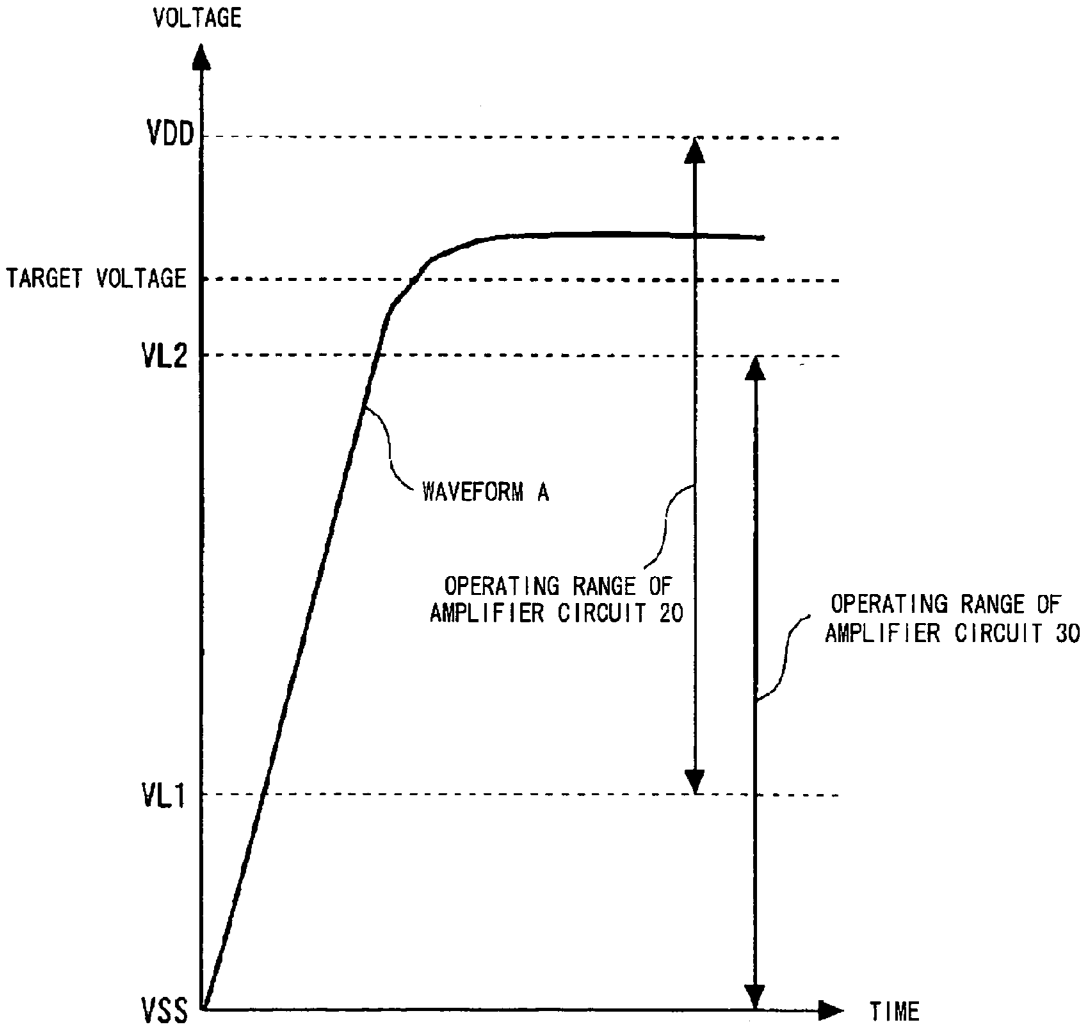
FIG . 18 PRIOR ART
FIG. 18 shows an example of a voltage waveform for explaining an operation of the conventional amplifier circuit.

Accordingly, in the present embodiment, even if the target voltage is equal to or more than the voltage V2, overshooting as seen in an output waveform (refer to FIG. 17) due to the conventional driving circuit in FIG. 16 can be suppressed to a sufficiently small level, so that high accuracy output can be implemented.

Likewise, when the target voltage is less than the reference voltage Vm, the potential difference between the target voltage and the voltage V1 is reduced to fall within the range of a certain small potential difference. Thus, undershooting is suppressed, so that high accuracy output can be implemented. Furthermore, by suppressing overshooting and undershooting, driving to the target voltage during the second period T2 can be quickly carried out. Thus, the second period T2 can be set to a short period.

Incidentally, when a change in voltage is great during the first period T1 as seen in the waveform 1 or the waveform 3, overshooting or undershooting sometimes occurs when the output terminal is driven to the voltage V2 or the voltage V1. In order to drive the output terminal 2 to the target voltage, it is necessary that the output terminal 2 should be driven to a voltage within a common operating range (i.e. within the overlapped range defined by the VL1 as its lower limit and the VL2 as its upper limit) of the charging amplifier circuit 20 and the discharging amplifier circuit 30. In order to do so, it is preferable that the voltage V1 and the voltage V2 are set to be rather higher than the voltage VL1 and rather lower than the voltage VL2, respectively. During the first period T1, the output terminal should be driven to a voltage close to the voltage VL1 (i.e. around the voltage V1) or a voltage close to the voltage VL2 (i.e. around the voltage V2) within the common operating range, and high voltage accuracy of driving is not required. For this reason, the first period T1 can be set to a sufficiently short time.

As described above, in the present embodiment, either of the voltage V1 (>VL1) or the voltage V2 (<VL2) is supplied to the charging amplifier circuit 20 and the discharging amplifier circuit 30 responsive to the voltage level of the target voltage Vin during the first period T1 through the input control circuit 10, and then the output terminal 2 is driven to the voltage (voltage V1 or V2) once. Then, during the second period T2, the target voltage Vin is supplied to the charging amplifier circuit 20 and the discharging amplifier circuit 30, and then the output terminal 2 is driven to the target voltage.

This enables the output terminal 2 to be driven to an arbitrary voltage within the power supply voltage range (from the low-potential supply voltage VSS to the high-potential supply voltage VDD) irrespective of its potential state at the start of one data period. Further, by driving the output terminal 2 to the voltage V1 or the voltage V2 once, overshooting and undershooting can be suppressed to a small level. High accuracy output can also be achieved. Still further, since the first period and the second period can be set to short periods, quick driving can also be carried out.

Figure 4A:
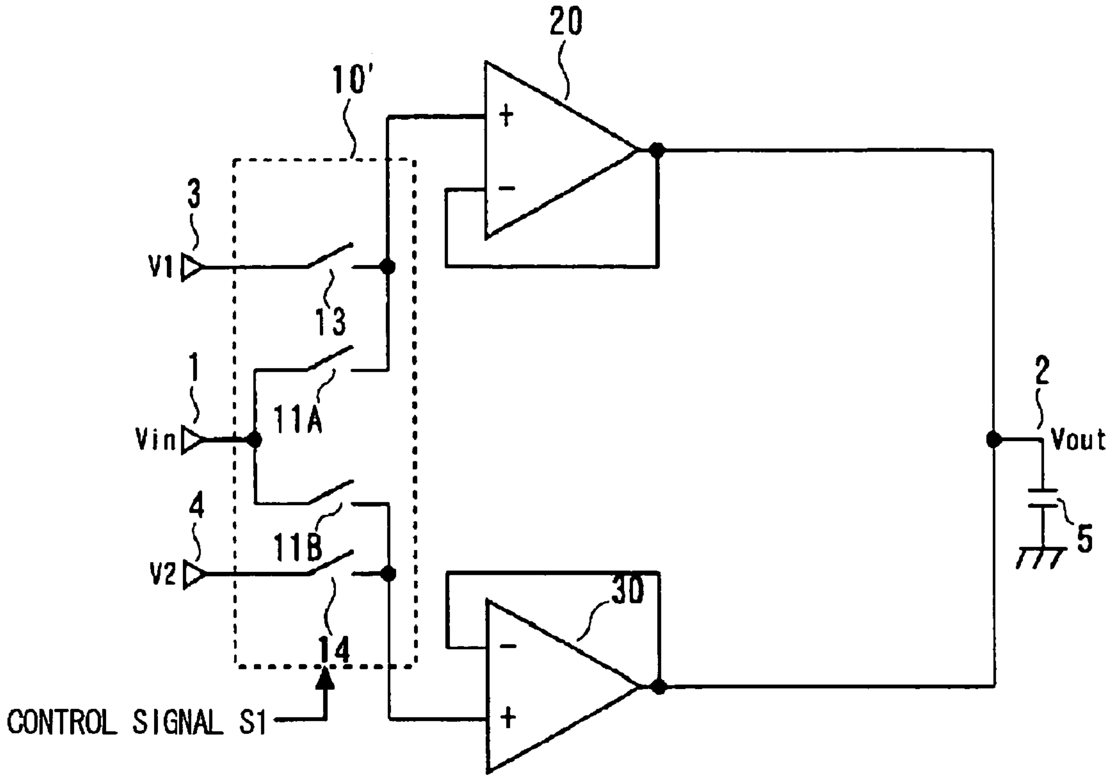
Figure 4B:
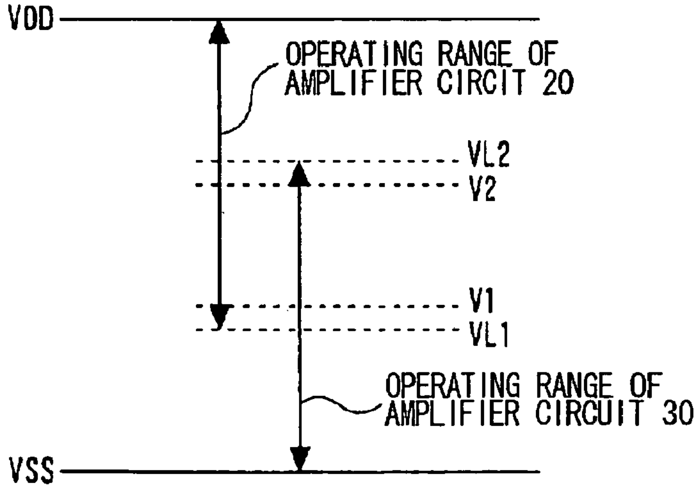

FIGS. 4A and 4B are diagrams showing a configuration of a driving circuit according to a second embodiment of the present invention. FIG. 4A shows the configuration of the driving circuit constituted from the charging amplifier circuit 20, discharging amplifier circuit 30, and input control circuit 10', while FIG. 4B is a diagram showing the operating ranges of the charging amplifier circuit 20 and the discharging amplifier circuit 30. A description will be given below with reference to FIGS. 4A and 4B.

The charging amplifier circuit 20 and the discharging amplifier circuit 30 are of the same voltage follower configuration as in FIG. 1, and current amplify the voltages supplied to their non-inverting input terminals (+) to charge and drive and discharge and drive the output terminal 2 to which the capacitive load 5 is connected, respectively.

Referring to FIG. 4, the input control circuit 10' has one switch added to the configuration shown in FIG. 1 and comprises a first terminal 1, a second terminal 3 and a third terminal 4, first and second switches 11A and 11B, the third switch 13, and the fourth switch 14. The input voltage Vin is supplied to the terminal 1. The first and second switches 11A and 11B are connected to the input terminals (non-inverting input terminals) of the charging amplifier circuit 20 and the discharging amplifier circuit 30, respectively. The third switch 13 is connected between the terminal 3 to which the voltage V1 is supplied and the input terminal (non-inverting input terminal) of the charging amplifier circuit 20. The fourth switch 14 is connected between the terminal 4 to which the voltage V2 is supplied and the input terminal (non-inverting input terminal) of the discharging amplifier circuit 30.

The switches 11A, 11B, 13, and 14 in the input control circuit 10' are adapted to be turned on/off by the control signal S1.

The operating range of the charging amplifier circuit 20 is set in the range from the voltage VL1 to the high-potential supply voltage VDD, and the output terminal 2 in a low potential state can be charged and driven with respect to the input voltage Vin within this range.

The operating range of the discharging amplifier circuit 30 is set in the range from the low-potential supply voltage VSS to the voltage VL2, and the output terminal 2 in a high potential state can be discharged and driven with respect to the input voltage Vin within this range.

The voltages V1 and V2 are set to be close to the voltages VL1 and VL2, respectively. Incidentally, referring to FIG. 4, same reference numerals are used for elements that are the same as and comparable to those in FIG. 1.

Next, the control and the operation of the input control circuit 10' in the driving circuit in FIG. 4 will be described with reference to FIG. 5.

FIG. 5 shows control over the switches 11A, 11B, 13, and 14 during one data driving period for driving the output terminal 2 to the target voltage.

The two periods constituted from the first period T1 and the second period T2 are provided for the one data driving period. The control signal S1 for controlling the input control circuit 10' controls the respective switches according to the first period T1 and the second period T2.

The present embodiment shows the case where the input control circuit 10' supplies the voltage V1 to the input terminal (non-inverting input terminal) of the charging amplifier circuit 20, and supplies the voltage V2 to the input terminal (non-inverting input terminal) of the discharging amplifier circuit 30 during the first period T1.

More specifically, referring to FIG. 5, the switches 11A and 11B are turned off, and the switches 13 and 14 are turned on during the first period T1; then, the voltage V1 is supplied to the non-inverting input terminal of the charging amplifier circuit 20, and the voltage V2 is supplied to the non-inverting input terminal of the discharging amplifier circuit 30.

The charging amplifier circuit 20 then raises the voltage of the output terminal 2 that is in a state equal to or less than the voltage V1 to the voltage V1.

The charging amplifier circuit 20 does not act on the output terminal 2 that is in a potential state equal to or more than the voltage V1 (does not perform charging).

On the other hand, the discharging amplifier circuit 30 brings down the voltage of the output terminal 2 that is in a state equal to or more than the voltage V2 to the voltage V2. The discharging amplifier circuit 30 does not act on the output terminal 2 that is in a potential state equal to or less than the voltage V2 (does not perform discharging).

Accordingly, during the first period T1, the output terminal 2 is driven to a voltage within the range which is not less than the voltage V1 nor more than the voltage V2 irrespective of its potential state before the first period T1. Since high accuracy in driving voltage is not required in this period, the first period T1 can be set to a sufficiently short time.

Next, during the second period T2, the switches 11A and 11B are turned on, and the switches 13 and 14 are turned off, and the input voltage Vin is supplied to the input terminals (non-inverting input terminals) of the charging amplifier circuit 20 and the discharging amplifier circuit 30. If the input voltage Vin is equal to or more than the voltage V2 at this point, the output terminal 2 is driven to the voltage Vin through the charging operation of the charging amplifier circuit 20.

If the input voltage Vin is equal to or less than the V1, the output terminal 2 is driven to the voltage Vin through the discharging operation of the discharging amplifier circuit 30.

If the input voltage Vin is not less than the voltage V1 nor more than the voltage V2, the output terminal 2 is driven to the voltage Vin through the operation of the charging amplifier circuit 20 or the discharging amplifier circuit 30.

Accordingly, the output terminal 2 can be driven to the voltage Vin with respect to an arbitrary input voltage Vin within the power supply voltage range (of not less than the low-potential supply voltage VSS nor more than the high-potential supply voltage VDD).

As described above, in the control shown in FIG. 5, by driving the output terminal to a voltage, which is not less than the voltage V1 and is not more than the voltage V2, once, driving that does not depend on its potential state at the start of one data period can be carried out. Then, if the input voltage Vin is lower than the voltage V1, the potential difference to the voltage Vin is small because the output terminal 2 is driven to a voltage which is not less than the voltage V1 nor more than the voltage V2, once. Accordingly, undershooting when the output terminal is driven to the voltage Vin can be suppressed to a small level, so that driving can be quickly performed. If the input voltage Vin is higher than the voltage V2, the potential difference to the voltage Vin is small because the output terminal is driven to a voltage being not less than the voltage V1 nor more than the voltage V2, once. Accordingly, overshooting when the output terminal is driven to the voltage Vin can be suppressed to a small level, so that driving can be quickly performed. If the input voltage Vin is not less than the voltage V1 nor more than the voltage V2, the charging amplifier circuit 20 and the discharging amplifier circuit 30 can both operate. Thus, the output terminal 2 can be quickly driven to the voltage Vin. As described above, during the second period T2 as well, overshooting and undershooting are suppressed, and quick driving to the target voltage is performed. Thus, the second period T2 can be set to a short period.

If the target voltage is given as the input voltage Vin, the output terminal 2 can be driven to the target voltage Vin with respect to an arbitrary voltage Vin within the power supply voltage range.

Figure 6:
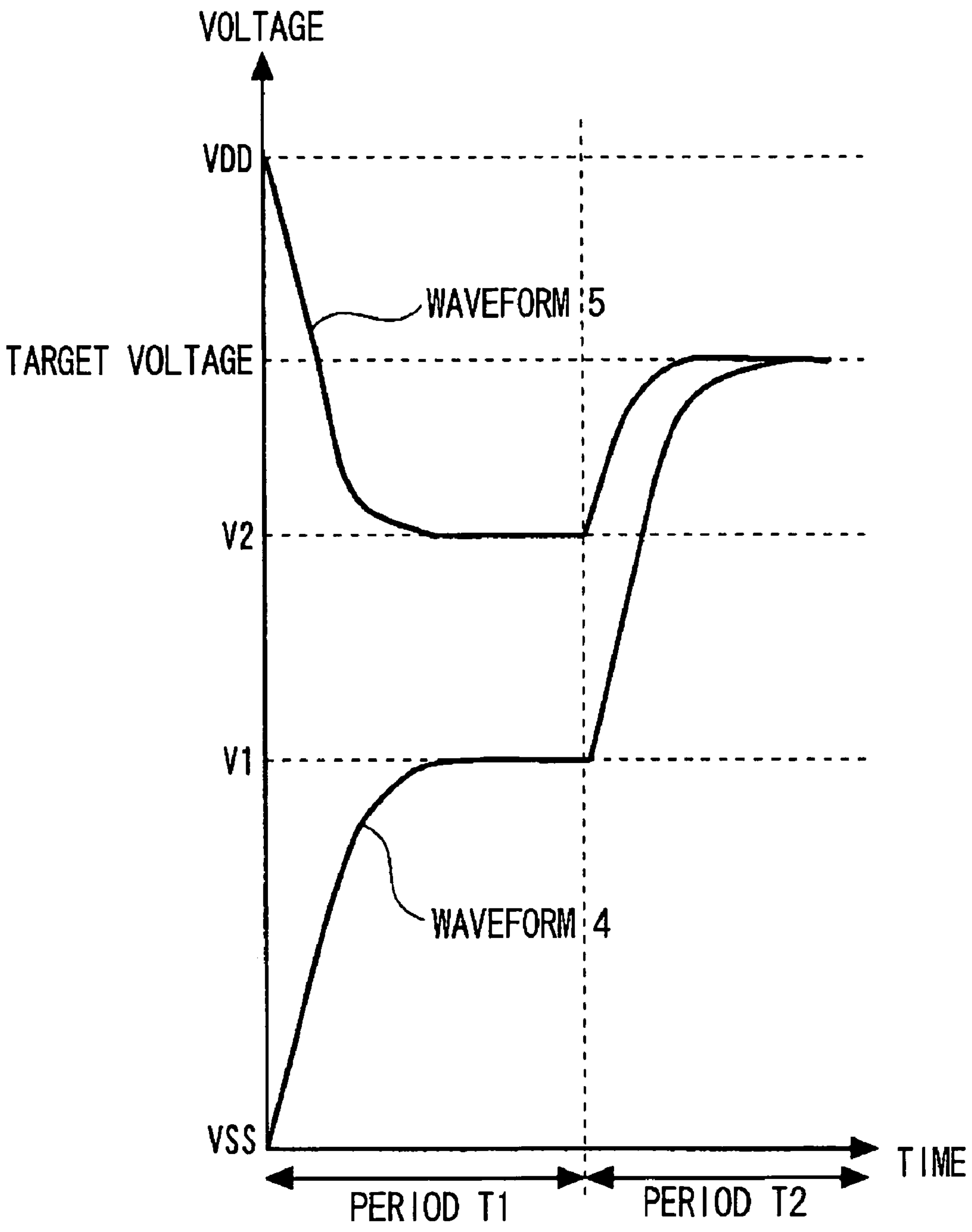
FIG. 6 shows examples of voltage waveforms for explaining an operation of the second embodiment of the present invention.

With reference to FIG. 6, the operation of the present embodiment is described in more detail. In FIG. 6, waveforms 4 and 5 are examples of the waveforms where the target voltage Vin to which the output terminal 2 is driven is higher than the voltage V2. The waveform 4 is the waveform of the output terminal voltage changing from around the low-potential power supply voltage VSS, while the waveform 5 is the waveform of the output terminal voltage changing from around the high-potential power supply voltage VDD.

The respective waveforms 4 and 5 are driven to voltages within the range which is not less than the voltage V1 nor more than the voltage V2, once, during the first period T1, and are driven to the target voltage during the second period T2.

As described above, once driving to a voltage within the range being not less than the voltage V1 nor more than the voltage V2, is performed during the first period T1, the potential difference between the voltage attained by driving during the first period T1 and the target voltage attained by final driving is reduced, and falls within the range of a certain small potential difference.

Accordingly, in the present embodiment as well, even if the target voltage is larger than the voltage V2 or smaller than the voltage V1, overshooting and undershooting can be suppressed to small levels to be achieve high accuracy output. Further, as in the first embodiment, the first period and the second period can be set to short times, so that quick driving can be also performed.

As described above, in the present embodiment, the voltage V1 is supplied to the non-inverting input terminal of the charging amplifier circuit 20 and the voltage V2 is supplied to the non-inverting input terminal of the discharging amplifier circuit 30 during the first period T1 through the input control circuit 10'. Then, the output terminal 2 is driven to a voltage in the range which is not less than the voltage V1 nor more than the voltage V2, once. Then, the target voltage Vin is supplied to the non-inverting input terminals of the charging amplifier circuit 20 and the discharging amplifier circuit 30 during the second period T2, so that the output terminal 2 is driven to the target voltage. This can perform driving to an arbitrary voltage within the power supply voltage range irrespective of the potential state at the start of one data period. Further, by performing driving of the output terminal to a voltage in the range which is not less than the voltage V1 nor more than the voltage V2 once, overshooting and undershooting can be suppressed to small levels to achieve high accuracy output. Further, as in the first embodiment, the first period and the second period can be set to short time periods, so that quick driving can be also performed If amplifier circuits with a simple configuration and lower power dissipation are used for the charging amplifier circuit 20 and the discharging amplifier circuit 30 in the first and second embodiments, area saving and lower power dissipation can be achieved.

Embodiments of the present invention will be described in further detail with reference to drawings. In the above described embodiments, there is provided the input control circuit 10 (or 10') in the driving circuit which comprises two amplifier circuits having different operating ranges in order to drive the output terminal to an arbitrary voltage within the power supply voltage range. Herein, specific examples of the charging amplifier circuit 20 and the discharging amplifier circuit 30 are shown, and it is shown that the present invention can achieve area saving and lower power dissipation. A display device that uses the present invention will also be described.

First Embodiment

Figure 7:
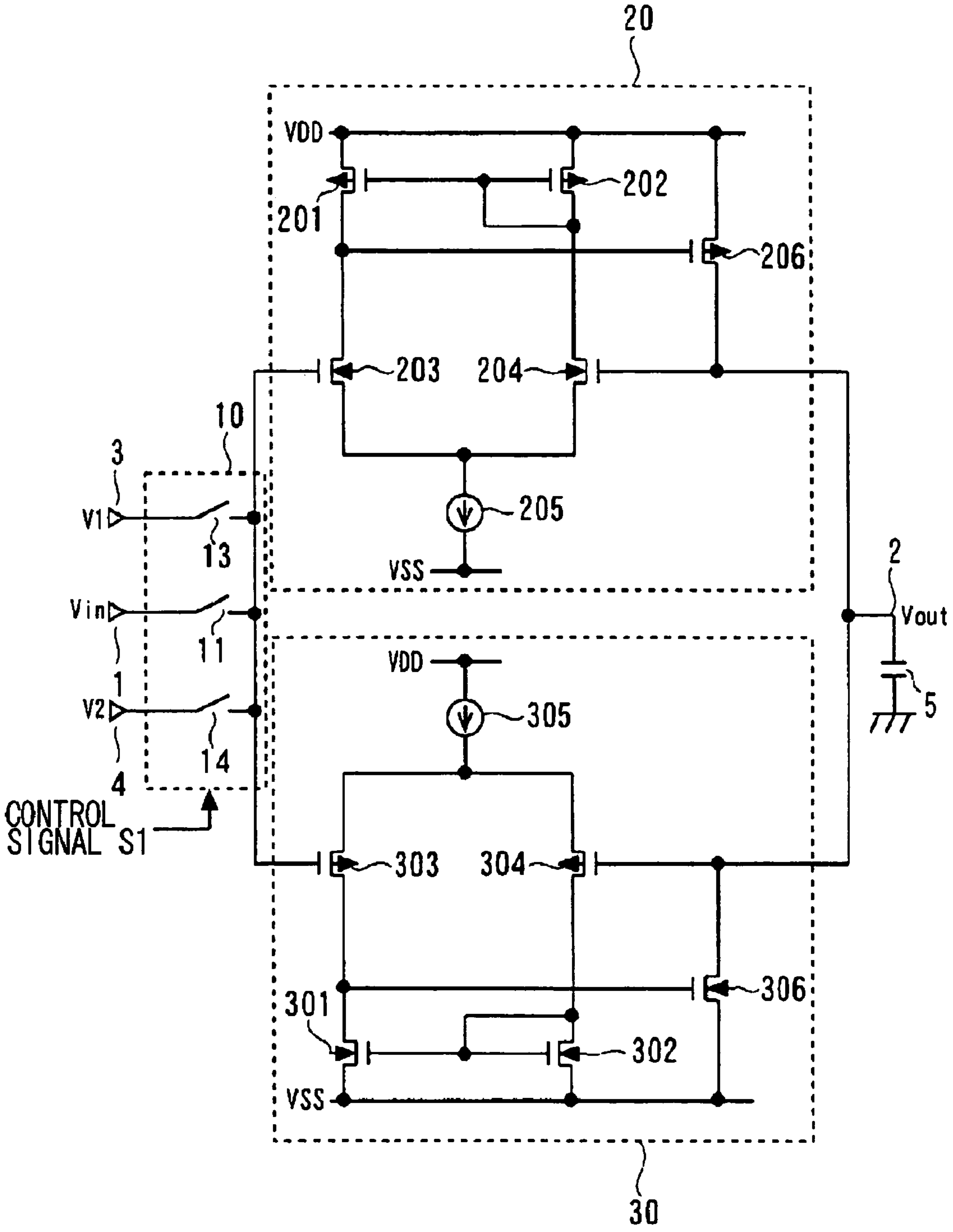
FIG. 7 is a diagram showing a configuration of the first embodiment of the present invention and showing a specific example of the amplifier circuits in FIG. 1.
Figure 8:
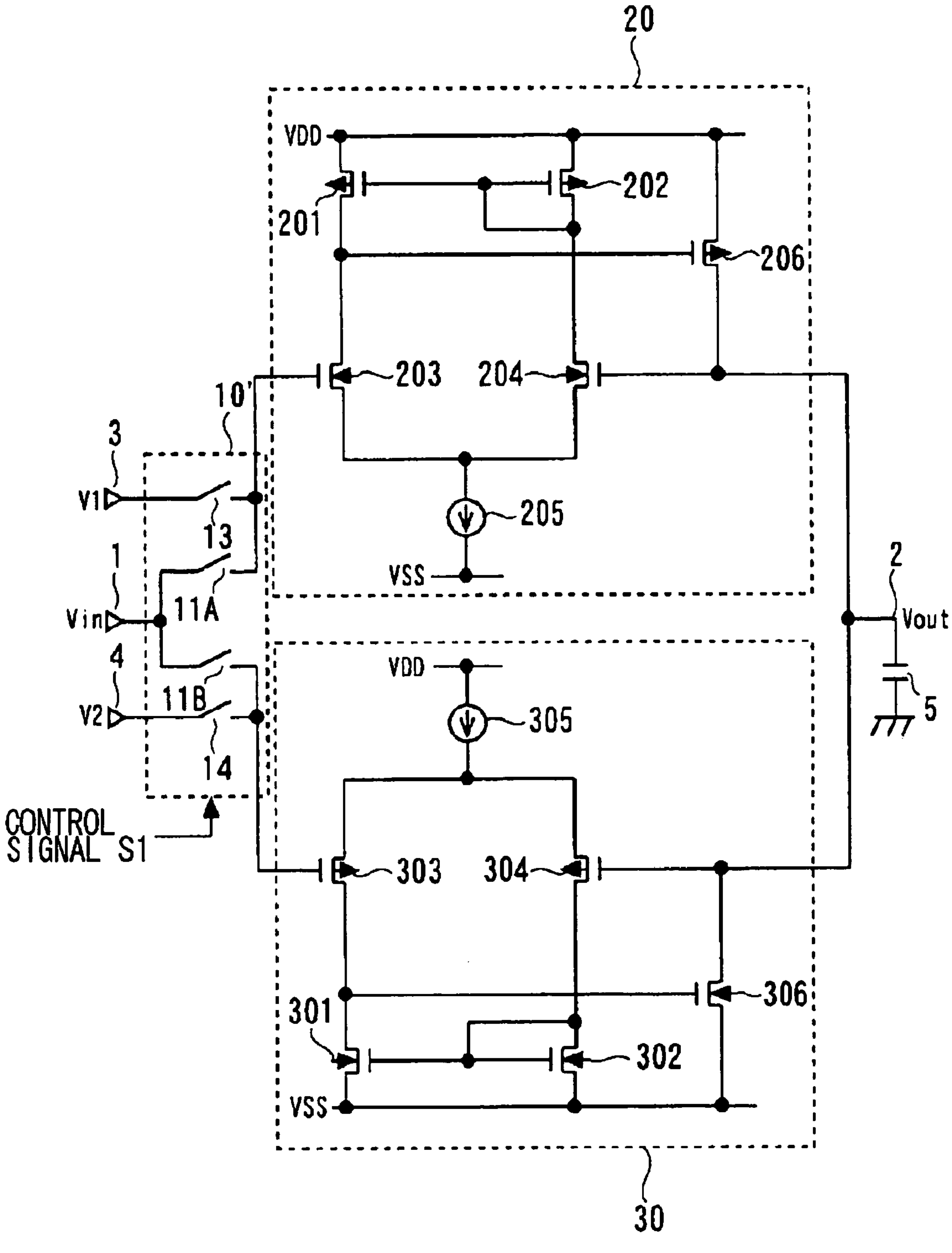
FIG. 8 is a diagram showing a configuration of the first embodiment of the present invention and showing a specific example of the amplifier circuits in FIG. 4.

FIGS. 7 and 8 are diagrams showing examples of specific configurations of the charging amplifier circuit 20 and the discharging amplifier circuit 30 in FIGS. 1 and 4, respectively. Hereinafter, the configurations of the charging amplifier circuit 20 and the discharging amplifier circuit 30 will be described.

The charging amplifier circuit 20 comprises an n-channel differential pair (composed by transistors 203 and 204) driven by a constant current source 205 and a p-channel current mirror circuit (composed by transistors 201 and 202) constituting an active load circuit for the differential pair. More specifically, one end of the constant current source 205 is connected to the low-potential supply voltage VSS, and the other end is connected to commonly coupled sources of the n-channel transistors 203 and 204 that constitute the differential pair. The current mirror circuit 201, 202 is composed by the p-channel transistors 201 and 202 of which sources are connected in common to a high-potential power supply VDD. The p-channel transistor 202 is diode connected, and its drain and gate are connected to the drain of the n-channel transistor 204. On the other hand, the control terminal (gate terminal) of the p-channel transistor 201 is connected in common to the control terminal (gate terminal) of the p-channel transistor 202, and its drain is connected to the drain of the n-channel transistor 203. The node connecting the drains of the transistors 201 and 203 is connected to the control terminal (gate terminal) of a p-channel transistor 206.

The control terminals (gate terminals) of the n-channel differential pair 203, 204 constitute a non-inverting input terminal and an inverting input terminal respectively. The control terminals (gate terminals) of the n-channel differential pair 203, 204 are connected to the input control circuit 10 (or 10') and the output terminal 2 respectively.

On the other hand, the discharging amplifier circuit 30 is comprises a p-channel differential pair (composed by transistors 303 and 304), driven by a constant current source 305, and an n-channel current mirror circuit (composed by transistors 301 and 302) that constitutes the active load circuit for the differential pair. More specifically, one end of the constant current source 305 is connected to the high-potential power supply VDD, and the other end is connected to the source common to the p-channel transistors 303 and 304 that constitute the differential pair. The current mirror circuit 301, 302 is composed by the n-channel transistors 301 and 302, and their respective sources are connected to the low-potential power supply VSS. The n-channel transistor 302 is diode connected, and its drain and gate are connected to the drain of the p-channel transistor 304. On the other hand, the control terminal (gate terminal) of the n-channel transistor 301 is connected in common to the control terminal (gate terminal) of the n-channel transistor 302, and its drain is connected to the drain of the p-channel transistor 303. The node connecting the transistors 301 and 303 is connected to the control terminal (gate terminal) of the n-channel transistor 306 connected between the low-potential power supply VSS and the output terminal 2. The control terminals (gate terminals) of the p-channel differential pair 303, 304 constitute the non-inverting input terminal and the inverting input terminal respectively. The control terminals of the p-channel differential pair 303, 304 are connected to the input control circuit 10 (or 10') and the output terminal 2 respectively. Referring to FIGS. 7 and 8, same reference numerals are assigned to the elements that are comparable to the elements in FIG. 16.

The charging amplifier circuit 20 and the discharging amplifier circuit 30 are the amplifier circuits of a voltage follower configuration being simple and having a small number of elements, as is commonly known. With regard to respective operating ranges of the charging amplifier circuit 20 and the discharging amplifier circuit 30, when an input voltage Vin is around the low-potential power supply VSS lower than a threshold voltage (Vtn) of the n-channel differential pair 203, 204 ($VSS \leqq Vin < Vtn$), the n-channel differential pair 203, 204 is turned off. Thus, the output terminal 2 cannot be charged. When the input voltage Vin is within the range of the high-potential power supply VDD minus a threshold voltage (Vhp) of the p-channel differential pair 303, 304 to the high-potential power supply VDD ($VDD-|Vhp|<Vin \leqq VDD$), the p-channel differential pair 303, 304 is turned off. Thus, the output terminal 2 cannot be discharged.

Now, let us assume that the voltages at which the n-channel differential pair 203, 204 and the p-channel differential pair 303, 304 are switched from an off state to an on state (an operable state) are set to VL1 and VL2, respectively.

The operating range of the charging amplifier circuit 20 is from the voltage VL1 to the high-potential power supply voltage VDD. With respect to the input voltage Vin within this range, the output terminal 2 in a low potential state can be charged and driven to the voltage Vin.

The operating range of the discharging amplifier circuit 30 is from the voltage VSS to the voltage VL2. With respect to the input voltage Vin within this range, the output terminal 2 in a high potential state can be discharged and driven to the voltage Vin.

As described above, the charging amplifier circuit 20 and the discharging amplifier circuit 30 shown in FIGS. 7 and 8 satisfy the operating ranges and operation performance of the charging amplifier circuit 20 and the discharging amplifier circuit 30 described in the embodiments. Accordingly, as described before, the driving circuits in the embodiment shown in FIGS. 7 and 8 can perform driving to an arbitrary voltage within the power supply voltage range, and high accuracy output can be implemented.

The configurations of the charging amplifier circuit 20 and the discharging amplifier circuit 30 shown in FIGS. 7 and 8 are of a very simple configuration with a small number of elements, having a small number of current paths and enabling lower power dissipation. That is, by setting current for the constant current sources 205 and 305 to be sufficiently small and by setting current flowing from the power supply voltage VDD to the VSS through transistors 206 and 306 to be sufficiently small in a state where an output voltage is stable, current flowing through the charging amplifier circuit 20 and the discharging amplifier circuit 30 can be controlled, so that power dissipation can be reduced.

An input control circuit 10 only performs control for supplying the voltage Vin, and voltages V1 and V2 to the control terminals of the transistors 203 and 303, with little power dissipation. Accordingly, the driving circuits shown in FIGS. 7 and 8 can realize area saving and lower power dissipation.

Figure 9:
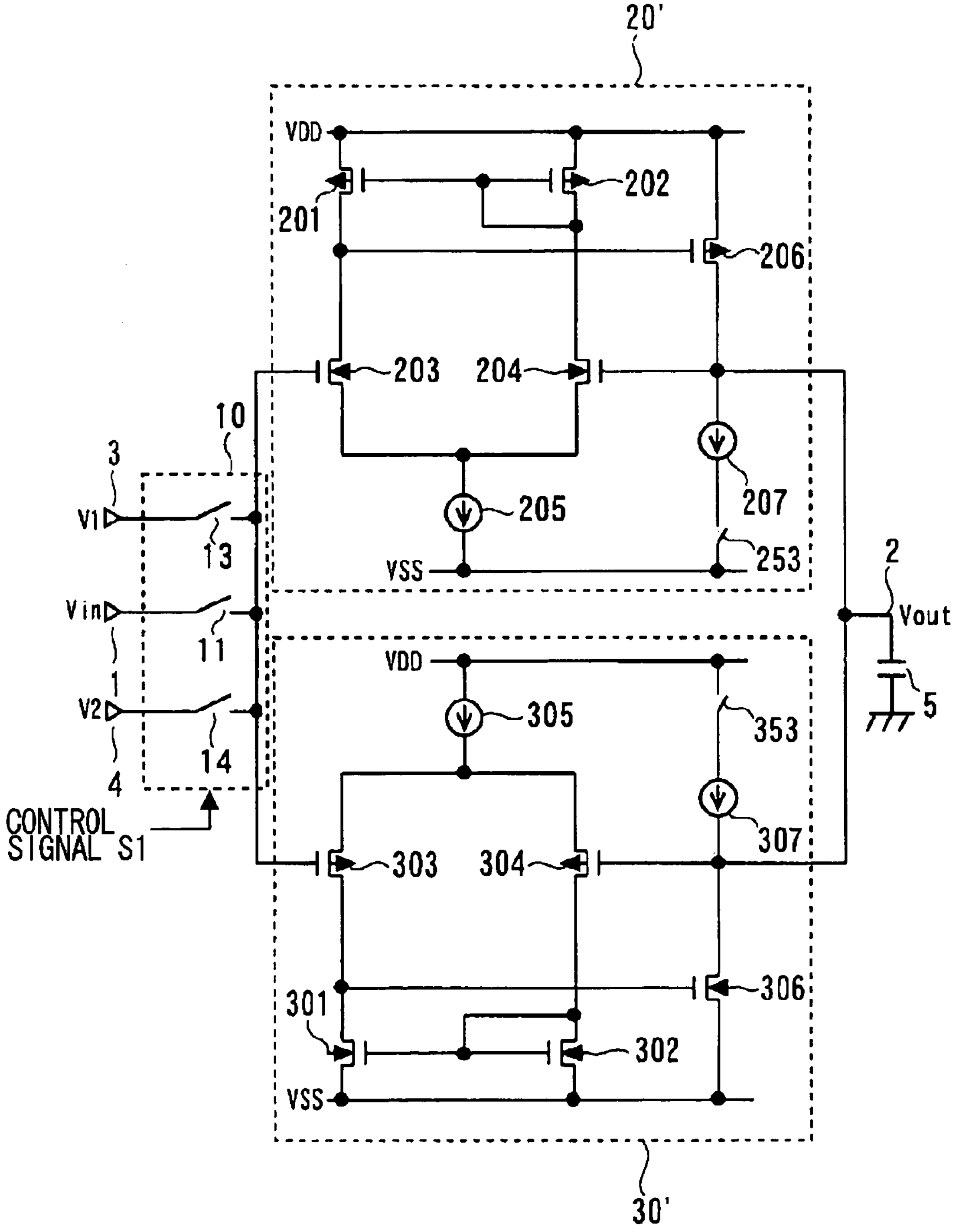
FIG. 9 is a diagram showing a configuration of the second embodiment of the present invention and showing a variation from FIG. 7.
Figure 10:
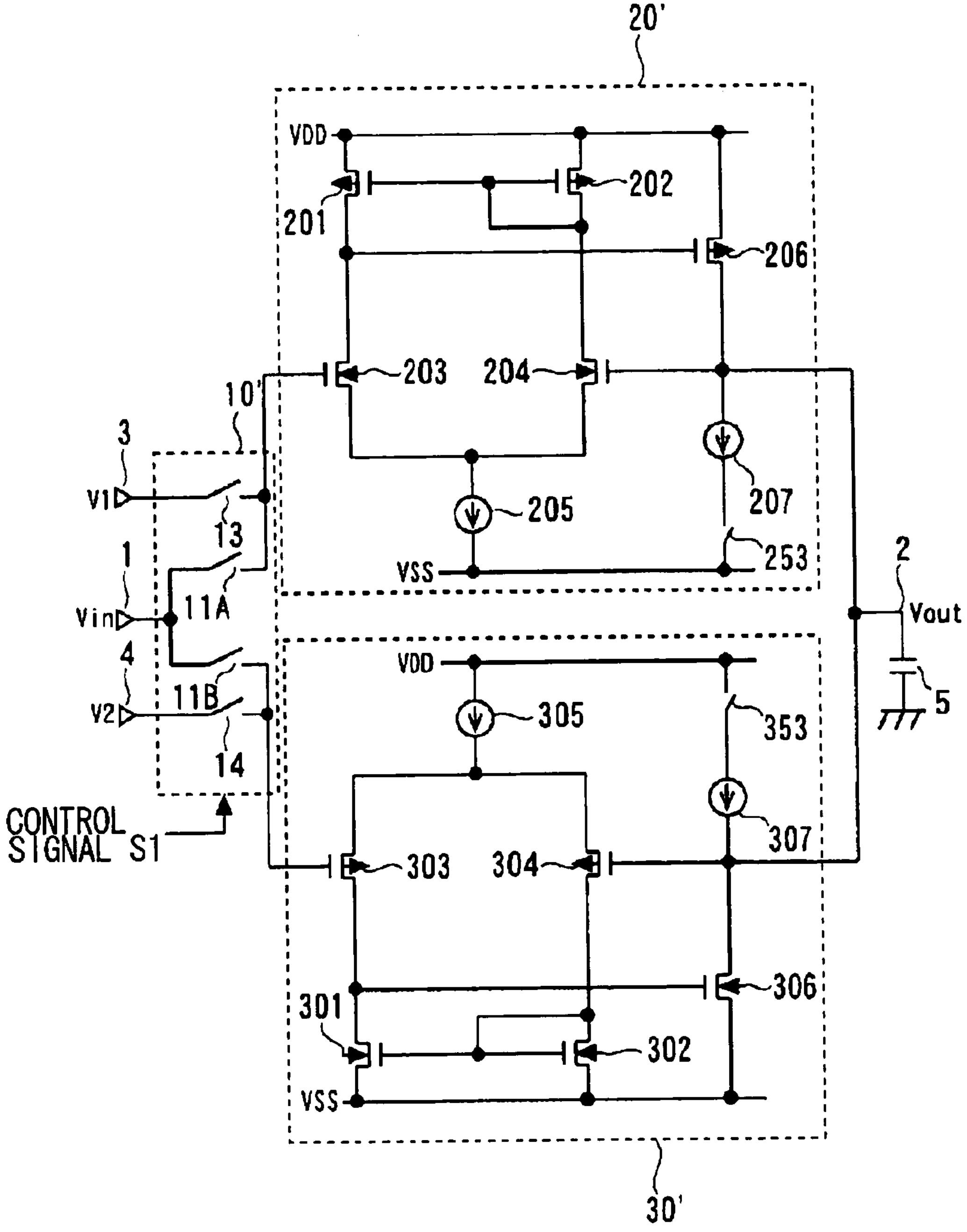
FIG. 10 is a diagram showing a configuration of the second embodiment and showing a variation from FIG. 8.

FIGS. 9 and 10 are diagrams showing a second embodiment of the present invention, and are the diagrams showing examples of variations of the charging amplifier circuit 20 and the discharging amplifier circuit 30 in FIGS. 7 and 8, respectively. Differences between a charging amplifier circuit 20' and a discharging amplifier circuit 30' in FIGS. 9 and 10 and those in FIGS. 7 and 8 are that a constant current source 207 is connected in series with a switch 253 between the output terminal 2 and the low-potential power supply VSS in the charging amplifier circuit 20', and that a constant current source 307 is connected in series with a switch 353 between the output terminal 2 and the high-potential power supply VDD in the discharging amplifier circuit 30'. Current for the constant current source 207 and the constant current source 307 are set to be sufficiently small. Other configurations in the charging amplifier circuit 20' and the discharging amplifier circuit 30' are the same as those in FIG. 7 with the input control circuit 10 and in FIG. 8 with the input control circuit 10'.

In the present embodiment, the operation and effect of providing the constant current sources 207 and 307 is that voltage accuracy for a target voltage to which the output terminal 2 is driven can be enhanced.

When the target voltage in the driving circuits shown in FIGS. 7 and 8 is larger (higher) than the voltage VL2, or smaller (lower) than the voltage VL1, only one of the charging amplifier circuit 20 and the discharging amplifier circuit 30 operates. A change in voltage during a second period T2 can be reduced so as to suppress overshooting and undershooting to a sufficiently small level. However, the charging amplifier circuit 20 can perform only charging, and the discharging amplifier circuit 30 can perform only discharging. Thus, even if slight overshooting or undershooting occurs, the driving circuits in FIGS. 7 and 8 cannot correct it.

Therefore, in the present embodiment, when the output terminal 2 is driven to a voltage higher than the voltage VL2, and is driven to a voltage lower than the voltage VL1, the constant current sources 207 and 307 are provided to correct overshooting and undershooting that have slightly occurred.

As described before, since overshooting and undershooting can be suppressed to the sufficiently small levels in the driving circuit according to the present invention, the currents for the constant current sources 207 and 307 can be set to be sufficiently small, so that an increase in power dissipation can be reduced to a minimum.

When the constant current sources 207 and 307 are operated simultaneously during the second period T2, their respective operations are canceled out. Thus, control is performed so that only one of the switches 253 and 353 is turned on. In order to perform such control, control over the switches 253 and 353 responsive to the input voltage Vin is necessary. A reference voltage Vm provided for control of the input control circuit 10 in FIG. 1 is set in FIGS. 9 and 10 as well.

FIG. 11 shows specific examples of control over the switches 253 and 353 in the driving circuit shown in FIGS. 9 and 10. It is assumed that control over the respective switches of the input control circuits 10 and 10' in FIGS. 9 and 10 is in accordance with FIGS. 2 and 5, and omitted in FIG. 11. Referring to FIG. 11, the switches 253 and 353 are turned off irrespective of the input Voltage Vin, and the constant current source 207 and 307 are both deactivated during a first period T1.

On the other hand, during the second period T2, when the input voltage Vin is equal to or more than the reference voltage Vm, only the switch 253 is turned on. Even when the target voltage (Vin) is higher than the voltage V2 and slight overshooting occurs due to driving during the second period T2, the output terminal voltage can be put back to the target voltage due to a discharging operation of the constant current source 207. Thus, high accuracy output is made possible.

When the target voltage (Vin) is not less than the reference voltage Vm nor more than the voltage V2, the amplifier transistors 206 and 306 can both operate. Thus, the operation of the constant current source 207 that has low discharging capability has no effect, so that the output terminal 2 is driven to the target voltage through the operation of the amplifier transistor 206 or 306.

During the second period T2, when the input voltage Vin is less than the reference voltage Vm, only the switch 353 is turned on. Even if the target voltage (Vin) is lower than the voltage V1 and slight undershooting occurs due to driving in the second period T2, the output terminal voltage can be put back to the target voltage due to a charging operation of the constant current source 307. Thus, high accuracy output is made possible.

When the target voltage (Vin) is not less than the voltage V1 nor more than the reference voltage Vm, the amplifier transistors 206 and 306 can both operate. Thus, the operation of the constant current source 307 having low charging capacity has no effect, so that due to the operation of the amplifier transistor 206 or 306, the output terminal 2 is driven to the target voltage.

As described above, by performing on/off control over the switches 253 and 353, as shown in FIG. 11, the driving circuits in FIGS. 9 and 10, can achieve higher accuracy output.

Figure 12:
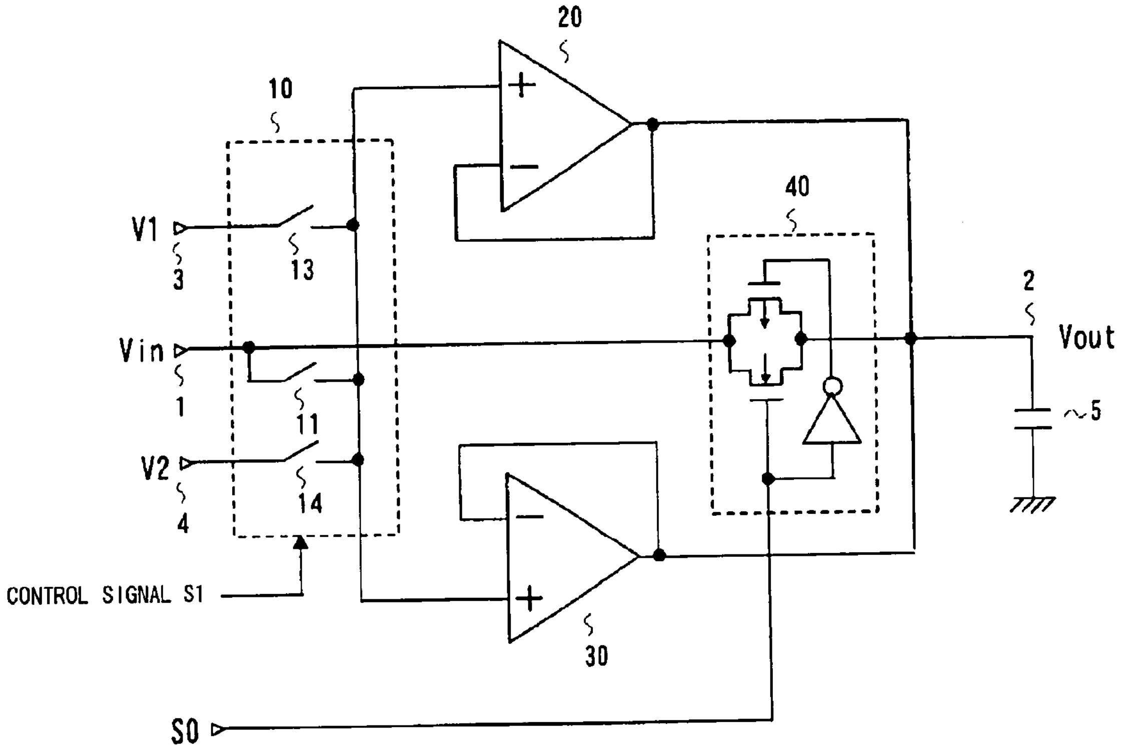
FIG. 12 is a diagram showing a configuration of a third embodiment of the present invention and showing another specific example of the amplifier circuits in FIG. 1.
Figure 13:
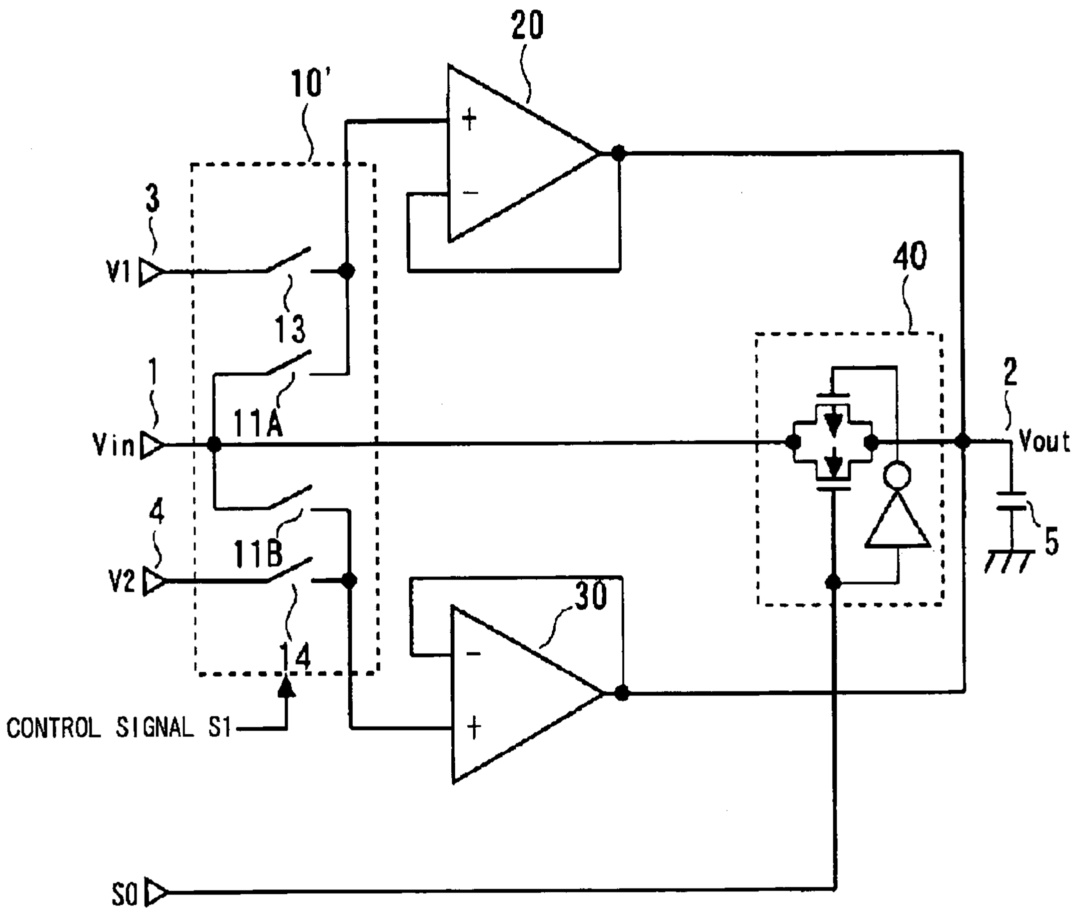
FIG. 13 is a diagram showing a configuration of the third embodiment of the present invention and showing another specific example of the amplifier circuits in FIG. 4.

FIGS. 12 and 13 are diagrams showing a third embodiment of the present invention. Referring to FIGS. 12 and 13, a transfer gate switch 40 controlled to be turned on/off by a signal S0 is inserted between the input terminal 1 and the output terminal 2. The configurations in FIGS. 7 through 10 can be applied to the amplifier circuits 20 and 30 in FIGS. 12 and 13.

In the driving circuits shown in FIGS. 12 and 13, a period T3 following the first period T1 and the second period T2 is provided in one data driving period. Then, during the third period T3, the switches 13 and 14 in the input control circuit 10 and the switches 11A, 11B, 13 and 14 in the input control circuit 10' are controlled to be turned off, and the transfer gate switch 40 is turned on. A capacitive load 5 directly connected to the output terminal 2 can be thereby driven directly through the current supply capability of the input voltage Vin supplied to the input terminal 1. During the third period T3, it is preferable that the charging amplifier circuit 20 and the discharging amplifier circuit 30 are also deactivated (stopped).

Figure 14:
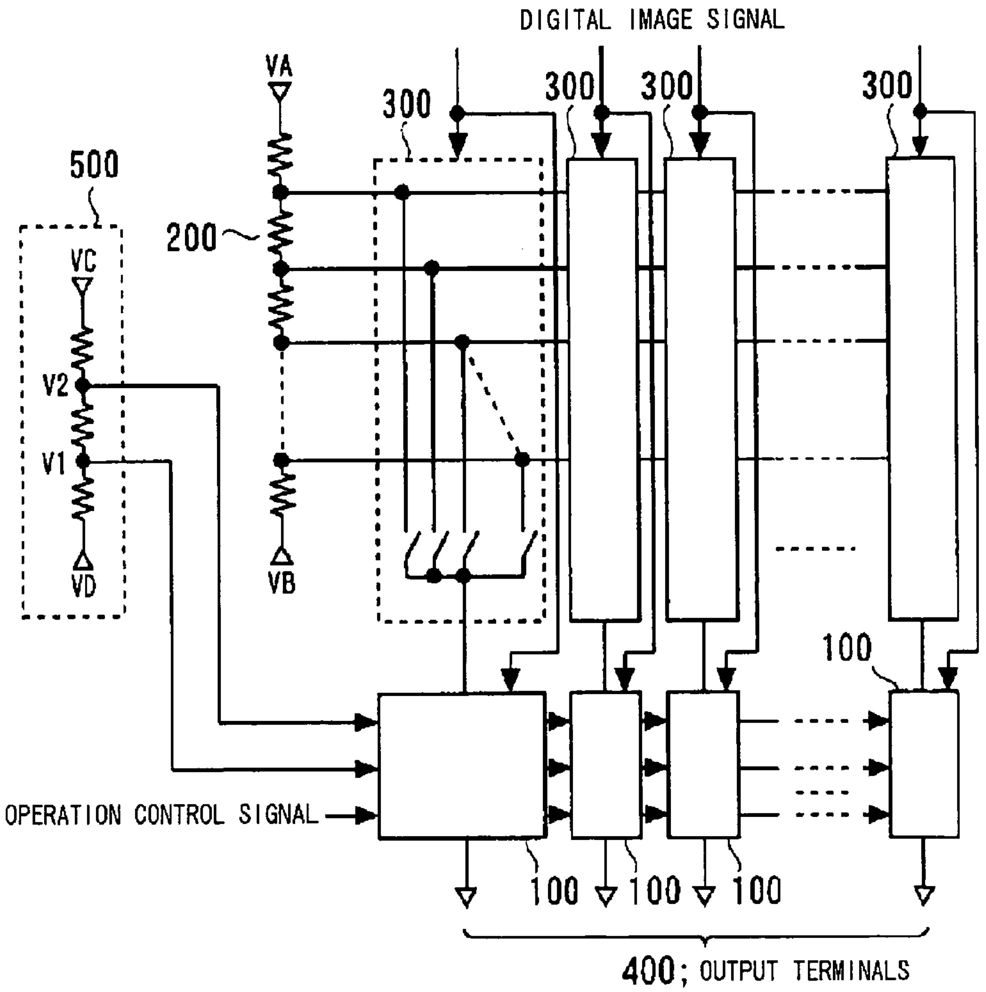
FIG. 14 is a diagram showing a configuration of a data driver of a display device.

FIG. 14 is a diagram showing a driving circuit according to a fourth embodiment of the present invention, and shows a configuration of a data driver of the display device. Referring to FIG. 14, the data driver comprises a resister string 200 connected across a voltage source VA and a voltage source VB, decoders 300, output terminals 400, and buffer circuits 100. Among a plurality of gray scale voltages generated from respective terminals (taps) of the resister string 200, a gray scale voltage is selected by a decoder 300 and supplied to a buffer circuit 100 for each output, responsive to a digital image signal, and a buffer circuit 100 performs current amplification to drive the data line connected to an output terminal 400. The voltages V1 and V2 are generated by a bias generation circuit 500 and supplied to the buffer circuit 100 associated with each output. FIG. 14 shows the configuration in which the bias generation circuit 500 generates the voltages V1 and V2 from the terminals (taps) of the resister string connected across the voltage source VC and the voltage source VD. It may also be configured that a plurality of transistors are connected in series between the voltage source VC and the voltage source VD as a substitute for the resister string, and using on resistances of the respective transistors, the voltages V1 and V2 are taken from connection terminals between the transistors. Part of the digital image signal supplied to the decoder 300 associated with each output is also supplied to the buffer circuit 100 as well.

Each of the circuits described with reference to FIG. 1, FIG. 4, FIGS. 7–10, FIG. 12, and FIG. 13 can be applied as the buffer circuit 100. The control signal S1 performs on/off control over respective switches in the buffer circuit 100.

Part of the digital signal supplied to the buffer circuit 100 can be employed for magnitude discrimination between the gray scale voltage selected by the decoder 300 and the reference voltage Vm, if the driving circuit in one of FIGS. 1, 7, 9, 10, and 12 is applied as the buffer circuit 100. More specifically, assume that digital image signals (D2, D1, D0) with eight gray scales are associated with gray scale voltages V0 to V7, (where V0<V1< . . . <V7), and assume that when V0=(0, 0, 0), V1=(0, 0, 1), . . . , and V7=(1, 1, 1), the reference voltage Vm is assigned to V4 (1, 0, 0). Then, if the digital signal D2 is supplied to the buffer circuit 100, it can be determined that the gray scale voltage supplied to the buffer circuit 100 is the gray scale voltage from the V4 to the V7, being equal to or larger than the Vm when the D2 is equal to one, and that the gray scale voltage supplied to the buffer circuit 100 is the gray scale voltage from the V0 to the V3, being less than the Vm when the D2 is equal to zero.

In the case of the driving circuits in FIGS. 4 and 8, which do not depend on the relationship between the gray scale voltage supplied to the buffer circuit 100 and the reference voltage Vm, part of the digital signal does not need to be supplied to the buffer circuit 100. When the amplifier circuits 20' and 30' in FIG. 9 are employed in the driving circuit shown in FIG. 13, part of the digital signal is supplied to the buffer circuit 100.

When the amplifier circuit in FIGS. 12 or 13 is applied as the buffer circuit 100, charges are directly supplied from the resistance string 200 to drive a data line when the transfer gate switch 40 is turned on.

By using the driving circuit according to the present invention as the buffer circuit 100 in FIG. 14, the data driver which achieves lower power dissipation and area saving can be readily configured.

Figure 15:
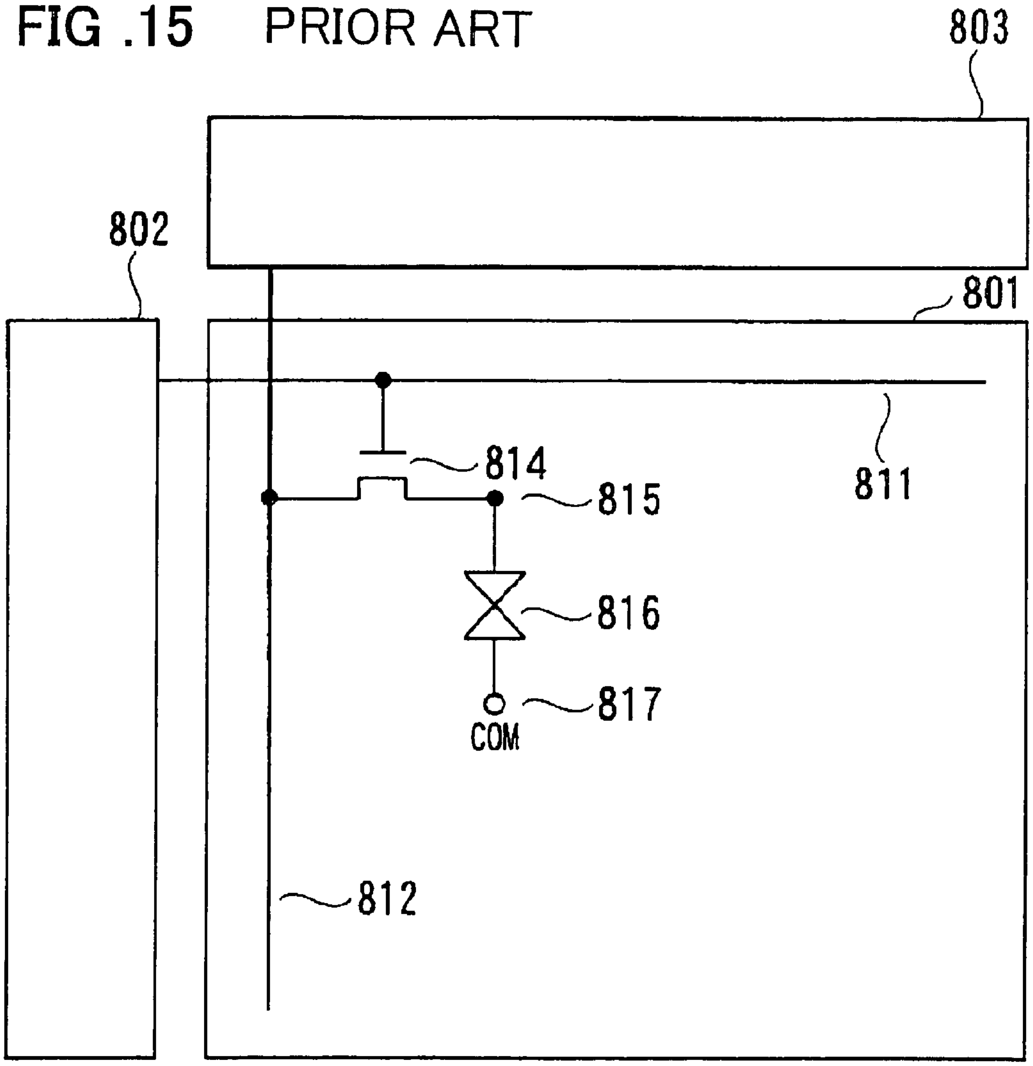
FIG .15 PRIOR ART
FIG. 15 is a diagram showing a configuration of a liquid crystal display device.

The data driver shown in FIG. 14 can be as a matter of course applied to the data line driving circuit 803 of the liquid crystal display device shown in FIG. 15.

The driving circuit described in the above embodiments is formed by MOS transistors. The driving circuit of the display device may also be formed by MOS transistors (TFTs) made of polycrystalline silicon, for example. Bipolar transistors can also be applied to the amplifier circuits described in the above embodiment. In this case, p-channel transistors for the current mirror circuit, differential pair, and the like are replaced by pnp transistors, while n-channel transistors are replace by npn transistors. Though the above embodiments showed examples of application to an integrated circuit, application to discrete devices of course also becomes possible.

The above description about the present invention was given in conjunction with the above-mentioned embodiments. The present invention, however, is not limited to the above embodiments, and naturally includes various variations and modifications that would be possible by those skilled in the art within the scope of the inventions in the respective claims in this application.

The meritorious effects of the present invention are summarized as follows.

As described above, a driving circuit according to the present invention is constituted from a first amplifier circuit, a second amplifier circuit, and an input control circuit. The first amplifier circuit has a first operating range and charges and drives an output terminal, while the second amplifier circuit has a second operating range and discharges and drives the output terminal. The input control circuit selects one of a voltage at an upper limit side (V2) of a range common to the first and second operating ranges, a voltage at a lower limit (V1) of the range, and a target voltage (Vin) and supplies the selected voltage to the input terminal of the first amplifier circuit or the second amplifier circuit. A first period (T1) and a second period (T2) are provided for one data driving period for driving the output terminal to the target voltage. During the first period (T1), the input control circuit supplies the voltage at the upper limit (V2) or the voltage at the lower limit (V1) to the input terminals of the first amplifier circuit and the second amplifier circuit. During the second period (T2), the input control circuit supplies the target voltage to the input terminals of the first amplifier circuit and the second amplifier circuit. This enables the output terminal to be driven to an arbitrary target voltage within a power supply voltage range irrespective of the potential state of the output terminal at the start of the one data driving period, and high accuracy output also becomes possible.

Further, according to the present invention, by constituting the first and second amplifier circuits from simple amplifier circuits each including a differential pair for differentially receiving input signal voltages from a non-inverting input terminal thereof and an inverting input terminal thereof, and an amplifier transistor for receiving its output to a control terminal thereof, lower power dissipation as well as area saving can be achieved.

According to a display device of the present invention, a data line driving circuit can drive the output terminal to an arbitrary voltage in an entire supply voltage range in an arbitrary sequence while suppressing an increase in the number of elements. Thus, even if the data line driving circuit is applied to the display device having a low power supply voltage, high speed display with high accuracy can be performed; thus, the data line driving circuit is suitable for a liquid crystal display device for a portable terminal or the like as well.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A driving circuit comprising:

a first amplifier circuit for charging and driving an output terminal of said driving circuit;

a second amplifier circuit for discharging and driving said output terminal;

said first and second amplifier circuits having respectively first and second operating voltage ranges overlapping at least in part each other; and an input control circuit receiving a first voltage located at a lower limit side of an overlapped portion between the first operating voltage range and the second operating voltage range, a second voltage located at an upper limit side of the overlapped portion, and a target voltage, for selecting at least one of the received voltages to supply the selected voltage to at least one of an input terminal of said first amplifier circuit and an input terminal of said second amplifier circuit;

wherein a driving period for driving said output terminal to the target voltage being made up by at least a first period and a second period;

said input control circuit performing control so that during the first period, one of the first voltage and the second voltage, is supplied in common to said input terminals of said first amplifier circuit and said second amplifier circuit, or the first and second voltages are respectively supplied to said input terminal of said first amplifier circuit and said input terminal of said second amplifier circuit, and during the second period, the target voltage is supplied in common to said input terminals of said first amplifier circuit and said second amplifier circuit.

2. The driving circuit according to claim 1, wherein said input control circuit supplies either of the first voltage and the second voltage to said input terminals of said first amplifier circuit and said second amplifier circuit in common during the first period.

3. The driving circuit according to claim 1, wherein said input control circuit supplies the first voltage and the second voltage to said input terminal of said first amplifier circuit and said input terminal of said second amplifier circuit, respectively.

4. The driving circuit according to claim 1, wherein said first amplifier circuit and said second amplifier circuit are both of a voltage follower configuration; and wherein during the first period, said input control circuit supplies the second voltage to said input terminals of said first amplifier circuit and said second amplifier circuit in common when the target voltage is equal to or more than a predetermined reference voltage within the overlapped portion between the first operating voltage range and the second operating voltage range, and supplies the first voltage to said input terminals of said amplifier circuit and said second amplifier circuit in common when the target voltage is less than the reference voltage.

5. The driving circuit according to claim 1, further comprising a switch connected between an input terminal from which said input control circuit receives said target voltage and said output terminal.

6. The driving circuit according to claim 1, wherein said first amplifier circuit comprises:

a first differential pair of a first polarity having first and second input terminals, for differentially receiving input signal voltages from said first and second input terminals; and a first transistor connected between a first power supply and said output terminal, and having a control terminal coupled to an output of said first differential pair; and wherein said second amplifier circuit comprises:

a second differential pair of a second polarity having first and second input terminals, for differentially receiving input signal voltages from said first and second input terminals; and a second transistor connected between a second power supply and said output terminal, and having a control terminal coupled to an output of said second differential pair.

7. The driving circuit according to claim 1, wherein said first amplifier circuit comprises:

a first differential pair of a first polarity having first and second input terminals, for differentially receiving input signal voltages from said first and second input terminals; and a first transistor connected between a first power supply and said output terminal, and having a control terminal coupled to an output of said first differential pair;

wherein said second amplifier circuit comprises:

a second differential pair of a second polarity having first and second input terminals, for differentially receiving the input signal voltages from said first and second input terminals; and a second transistor connected between a second power supply and said output terminal, and having a control terminal coupled to an output of said second differential pair;

said first input terminals of said first and second differential pairs being connected in common; and wherein said input control circuit comprises first through third switches, each having one terminal for receiving the first voltage, the second voltage and the target voltage, respectively; the other terminals of said first through third switches being connected in common to said commonly coupled first input terminals of said first and second differential pairs.

8. The driving circuit according to claim 1, wherein said first amplifier circuit comprises:

a first differential pair of a first polarity having first and second input terminals, for differentially receiving input signal voltages from said first and second input terminals; and a first transistor connected between a first power supply and said output terminal, and having a control terminal coupled to an output of said first differential pair;

wherein said second amplifier circuit comprises:

a second differential pair of a second polarity having first and second input terminals, for differentially receiving the input signal voltages from said first and second input terminals; and a second transistor connected between a second power supply and said output terminal, and having a control terminal coupled to an output of said second differential pair; and wherein said input control circuit comprises:

first and second switches, each having one terminal for receiving the first voltage and the second voltage, respectively; and third and fourth switches, each having one terminal for receiving the target voltage in common;

the other terminals of said first and third switches being connected in common to said first input terminal of said first differential pair; and the other terminals of said second and fourth switches being connected in common to said first input terminal of said second differential pair.

9. The driving circuit according to claim 6, wherein in said first and second amplifier circuits, said first input terminals of said first and second differential pairs constitute non-inverting input terminals, and said second input terminals of said first and second differential pairs constitute inverting input terminals and are connected to said output terminal.

10. The driving circuit according to claim 7, wherein said first through third switches are adapted to be turned on or off by a control signal so that during the first period, said first or second switch is turned on, while said third switch is turned off; and during the second period, said third switch is turned on, while said first and second switches are turned off.

11. The driving circuit according to claim 8, wherein said first through fourth switches are adapted to be turned on or off by a control signal so that during the first period, said first and second switches are turned on, while said third and fourth switches are turned off; and during the second period, said third and fourth switches are turned on, while said first and second switches are turned off.

12. The driving circuit according to claim 1, wherein said first amplifier circuit comprises:

a first current source connected to a second power supply;

a first differential pair of a first polarity being driven by said first current source and having a non-inverting input terminal and an inverting input terminal, said first differential pair differentially receiving input signal voltages from said non-inverting input terminal and said inverting input terminal thereof;

a first load circuit connected between a pair of outputs of said first differential pair and a first power supply; and a first transistor being connected between said first power supply and said output terminal, and having a control terminal coupled to one of the pair of outputs of said first differential pair;

wherein said second amplifier circuit comprises:

a second current source connected to said first power supply;

a second differential pair of a second polarity, being driven by said second current source and having a non-inverting input terminal and an inverting input terminal, said second differential pair differentially receiving the input signal voltages from said non-inverting input terminal and said inverting input terminal thereof;

a second load circuit connected between a pair of outputs of said second differential pair and said second power supply; and a second transistor being connected between said second power supply and said output terminal, and having a control terminal coupled to one of the pair of outputs of said second differential pair;

said respective inverting input terminals of said first and second differential circuits being connected to said output terminal;

wherein said input control circuit comprises first through third switches, each having one terminal for receiving the first voltage, the second voltage, and the target voltage, respectively; the other terminals of said first through third switches being connected in common to said commonly coupled non-inverting input terminals of said first and second amplifier circuits;

wherein said first amplifier circuit further comprises:

a third current source and a fourth switch connected in series between said second power supply and said output terminal; and wherein said second amplifier circuit further comprises:

a fourth current source and a fifth switch, connected in series between said first power supply and said output terminal.

13. The driving circuit according to claim 1, wherein said first amplifier circuit comprises:

a first current source connected to a second power supply;

a first differential pair of a first polarity driven by said first current source and having a non-inverting input terminal and an inverting input terminal, said first differential pair differentially receiving input signal voltages from said non-inverting input terminal and said inverting input terminal thereof;

a first load circuit connected between a pair of outputs of said first differential pair and a first power supply; and a first transistor being connected between said first power supply and said output terminal, and having a control terminal coupled to one of the pair of outputs of said first differential pair;

wherein said second amplifier circuit comprises:

a second current source connected to said first power supply;

a second differential pair of a second polarity, driven by said second current source and having a non-inverting input terminal and an inverting input terminal, said second differential pair differentially receiving the input signal voltages from said non-inverting input terminal and said inverting input terminal thereof;

a second load circuit connected between a pair of outputs of said differential pair and said second power supply; and a second transistor being connected between said second power supply and said output terminal, and having a control terminal coupled to one of the pair of outputs of said second differential pair;

said respective inverting input terminals of said first and second differential circuits being connected to said output terminal;

wherein said input control circuit comprises:

first and second switches, each having one terminal for receiving the first voltage and the second voltage respectively; and third and fourth switches, each having one terminal for receiving the target voltage in common;

the other terminals of said first and third switches being connected in common to said non-inverting input terminal of said first amplifier circuit;

the other terminals of said second and fourth switches being connected in common to said non-inverting input terminal of said second amplifier circuit;

wherein said first amplifier circuit further comprises:

a third current source and a fifth switch connected in series between said second power supply and said output terminal; and wherein said second amplifier circuit further comprises:

a fourth current source and a sixth switch, connected in series between said first power supply and said output terminal.

14. The driving circuit according to claim 12, wherein said first through fifth switches are adapted to be turned on or off by a control signal so that;

during the first period, said first or second switch is turned on, said third switch is turned off, and said fourth and fifth switches are turned off; and during the second period, said third switch is turned on, said first and second switches are turned off, and one of said fourth and fifth switches is turned on.

15. The driving circuit according to claim 13, wherein said first through sixth switches are adapted to be turned on or off by a control signal so that during the first period, said first and second switches are turned on, said third and fourth switches are turned off, and said fifth and sixth switches are turned off; and during the second period, said third and fourth switches are turned on, said first and second switches are turned off, and one of said fifth and sixth switches is turned on.

16. The driving circuit according to claim 1, wherein said first and second amplifier circuits are of a voltage follower configuration.

17. The driving circuit according to claim 1, further comprising:

a switch connected between an input terminal from which said input control circuit receives said target voltage and said output terminal:

wherein said driving period for driving said output terminal to the target voltage further comprises a third period after the first period and the second period; and during the third period, said switch connected between said input terminal and said output terminal is turned on.

18. The driving circuit according to claim 1, wherein a lower limit and an upper limit of the first operating voltage range are defined by a first threshold voltage defining the lower limit of the first operating voltage range of said first amplifier circuit and a high-potential power supply voltage, respectively;

wherein an upper limit and a lower limit of the second operating voltage range are defined, by a second threshold voltage defining the upper limit of the second operating voltage range of said second amplifier circuit and a low-potential power supply voltage, respectively; and wherein the first voltage is set to be equal to or more than the first threshold voltage; and the second voltage is set to be higher than the first voltage and equal to or less than the high-power potential power supply voltage minus said second threshold voltage.

19. The driving circuit according to claim 7, wherein in said first and second amplifier circuits, said first input terminals of said first and second differential pairs constitute non-inverting input terminals, and said second input terminals of said first and second differential pairs constitute inverting input terminals and are connected to said output terminal.

20. The driving circuit according to claim 8, wherein in said first and second amplifier circuits, said first input terminals of said first and second differential pairs constitute non-inverting input terminals, and said second input terminals of said first and second differential pairs constitute inverting input terminals and are connected to said output terminal.

21. A driving circuit having an input terminal and an output terminal and outputting an output signal from said output terminal responsive to a signal voltage supplied to said input terminal, said driving circuit comprising:

an amplifier circuit for at least one of charging and discharging, and driving a capacitive load connected to said output terminal, based on the signal voltage at said input terminal; and an input control circuit for performing control so that a predetermined constant voltage within an operating voltage range of said amplifier circuit and the signal voltage supplied to said input terminal are switched for supply to an input terminal of said amplifier circuit, wherein said amplifier circuit includes:

a first amplifier circuit for charging and driving said output terminal; and a second amplifier circuit for discharging and driving said output terminal;

said first and second amplifier circuits having respectively first and second operating voltage ranges overlapping at least in part each other;

wherein said input control circuit performs control so that at least one of a first voltage located at a lower limit side of an overlapped portion between the first operating voltage range and the second operating voltage range, a second voltage located at an upper limit side of the overlapped portion, and a target voltage supplied to said input terminal is supplied to at least one of an input terminal of said first amplifier circuit and an input terminal of said second amplifier circuit;

wherein a driving period for driving said output terminal to the target voltage including at least a first period and a second period;

said input control circuit performing control so that during the first period, one of the first voltage and the second voltage is supplied in common to said input terminals of said first amplifier circuit and said second amplifier circuit, or the first voltage and the second voltage are supplied to said input terminal of said first amplifier circuit and said input terminal of said second amplifier circuit, respectively, and during the second period, the target voltage is supplied in common to said input terminals of said first amplifier circuit and said second amplifier circuit.

22. A display device comprising:

a plurality of data lines for supplying image signals to pixels on a display unit; and a driving circuit as set forth in claim 1, for driving said data lines.

23. A driving circuit having an input terminal and an output terminal and outputting an output signal from said output terminal responsive to a signal voltage supplied to said input terminal, said driving circuit comprising:

an amplifier circuit for charging and discharging and driving a capacitive load connected to said output terminal, based on the voltage at said input terminal;

wherein said amplifier circuit includes:

a first amplifier circuit for charging and driving said output terminal; and a second amplifier circuit for discharging and driving said output terminal;

said first and second amplifier circuits having respectively first and second operating voltage ranges overlapping at least in part each other; and an input control circuit for performing control so that a predetermined constant voltage within an overlapped portion between the first operating voltage range and the second operating voltage range and the signal voltage supplied to said input terminal are switched for supply to an input terminal of said amplifier circuit.

* * * * *